US007628701B2

(12) United States Patent
Wells

(10) Patent No.: US 7,628,701 B2
(45) Date of Patent: Dec. 8, 2009

(54) SYSTEM FOR INTERFACING A USER AND A CASINO GAMING MACHINE

(75) Inventor: William Wells, Reno, NV (US)

(73) Assignee: IGT, Reno, NV (US)

( * ) Notice: Subject to any disclaimer, the term of this patent is extended or adjusted under 35 U.S.C. 154(b) by 387 days.

(21) Appl. No.: 10/178,283

(22) Filed: Jun. 24, 2002

(65) Prior Publication Data

US 2004/0038721 A1 Feb. 26, 2004

(51) Int. Cl.

| | |
|---|---|
| ***A63F 13/02*** | (2006.01) |
| ***A63F 13/08*** | (2006.01) |
| ***A63F 13/10*** | (2006.01) |
| ***H03K 17/94*** | (2006.01) |
| ***H03M 11/06*** | (2006.01) |
| ***G06F 3/02*** | (2006.01) |
| ***G09G 5/22*** | (2006.01) |
| *A63F 3/06* | (2006.01) |
| *A63F 1/00* | (2006.01) |

(52) U.S. Cl. ............................. 463/37; 463/16; 463/30; 463/31; 463/36; 341/23; 345/172

(58) Field of Classification Search ................... 463/30, 463/31, 36–38, 16; 379/93.16, 916; 348/14.03; 345/173–178; 341/23; 708/145

See application file for complete search history.

(56) References Cited

U.S. PATENT DOCUMENTS

| | | | | |
|---|---|---|---|---|
| 3,757,322 A | | 9/1973 | Barkan et al. | |
| 4,078,257 A | * | 3/1978 | Bagley | 708/145 |
| 4,085,302 A | * | 4/1978 | Zenk et al. | 200/5 A |
| 4,224,615 A | | 9/1980 | Penz | |
| 4,825,212 A | | 4/1989 | Adler et al. | |
| 4,891,508 A | | 1/1990 | Campbell | |
| 5,342,047 A | | 8/1994 | Heidel et al. | |
| 5,376,946 A | | 12/1994 | Mikan | |

(Continued)

FOREIGN PATENT DOCUMENTS

AU 733239 * 7/2000

(Continued)

OTHER PUBLICATIONS

U.S. Appl. No. 60/335,865.*

(Continued)

*Primary Examiner*—Peter DungBa Vo
*Assistant Examiner*—Matthew D. Hoel
(74) *Attorney, Agent, or Firm*—Weaver Austin Villeneuve Sampson LLP

(57) ABSTRACT

Methods and apparatus for interfacing with a user at a casino gaming machine are disclosed. An input control panel with a plurality dynamic buttons is provided. The dynamic buttons may be activated by a player to select games, make wagers, make gaming decisions, etc. Each dynamic button may include a display area (e.g., an LCD), a transparent tactile feedback portion (e.g., a pliable polyurethane membrane), and an input detection portion (e.g., a transparent touch screen). A dynamic button may be depressed to make an input selection and may include a display area which is visible through the button. During operation of a dynamic button, the controller may send image data for display on the button and receive input signals from the input detection portion of the button when a user depresses the button.

32 Claims, 15 Drawing Sheets

U.S. PATENT DOCUMENTS

| | | | | |
|---|---|---|---|---|
| 5,515,045 | A | 5/1996 | Tak | |
| 5,580,310 | A | 12/1996 | Orus et al. | |
| 5,584,054 | A * | 12/1996 | Tyneski et al. | 455/566 |
| 5,598,527 | A | 1/1997 | Debrus et al. | |
| 5,680,160 | A | 10/1997 | LaPointe | |
| 5,788,573 | A * | 8/1998 | Baerlocher et al. | 463/16 |
| 5,818,361 | A * | 10/1998 | Acevedo | 341/23 |
| 5,867,149 | A * | 2/1999 | Jaeger | 345/172 |
| 5,887,995 | A * | 3/1999 | Holehan | 400/479.1 |
| 5,909,211 | A * | 6/1999 | Combs et al. | 345/172 |
| 5,929,474 | A | 7/1999 | Huang et al. | |
| 5,951,397 | A | 9/1999 | Dickinson | |
| 5,965,907 | A | 10/1999 | Huang et al. | |
| 5,977,704 | A | 11/1999 | Shi et al. | |
| 6,002,206 | A | 12/1999 | Harrison et al. | |
| 6,011,554 | A * | 1/2000 | King et al. | 715/811 |
| 6,027,115 | A | 2/2000 | Griswold et al. | |
| 6,028,271 | A | 2/2000 | Gillespie et al. | 178/18.01 |
| 6,067,074 | A * | 5/2000 | Lueders | 345/156 |
| 6,068,552 | A | 5/2000 | Walker et al. | |
| 6,072,475 | A | 6/2000 | van Ketwich | |
| 6,075,316 | A | 6/2000 | Shi et al. | |
| 6,135,884 | A * | 10/2000 | Hedrick et al. | 463/20 |
| 6,155,925 | A | 12/2000 | Giobbi et al. | |
| 6,205,690 | B1 | 3/2001 | Heropoulos et al. | |
| 6,210,279 | B1 | 4/2001 | Dickinson | 463/37 |
| 6,225,985 | B1 * | 5/2001 | Armstrong et al. | 345/177 |
| 6,227,970 | B1 * | 5/2001 | Shimizu et al. | 463/20 |
| 6,229,505 | B1 | 5/2001 | Fujii | |
| 6,234,898 | B1 | 5/2001 | Belamant et al. | |
| 6,251,014 | B1 | 6/2001 | Stockdale et al. | |
| 6,254,481 | B1 | 7/2001 | Jaffe | |
| 6,264,561 | B1 | 7/2001 | Saffari et al. | |
| 6,318,721 | B1 | 11/2001 | Randall et al. | |
| 6,454,649 | B1 | 9/2002 | Mattice et al. | |
| 6,517,433 | B2 | 2/2003 | Loose et al. | |
| 6,554,704 | B2 | 4/2003 | Nicastro et al. | |
| 6,609,978 | B1 | 8/2003 | Paulsen | |
| 6,620,047 | B1 | 9/2003 | Alcorn et al. | |
| 6,632,122 | B2 * | 10/2003 | Klitsner et al. | 446/484 |
| 6,636,203 | B1 * | 10/2003 | Wong et al. | 345/173 |
| 6,646,864 | B2 * | 11/2003 | Richardson | 361/681 |
| 6,667,738 | B2 * | 12/2003 | Murphy | 345/173 |
| 6,688,977 | B1 * | 2/2004 | Baerlocher et al. | 463/25 |
| 6,798,359 | B1 * | 9/2004 | Ivancic | 341/23 |
| 6,908,387 | B2 | 6/2005 | Hendrick et al. | |
| 6,988,247 | B2 * | 1/2006 | Janevski | 715/835 |
| 6,996,426 | B2 * | 2/2006 | Granberg | 455/575.4 |
| 7,053,890 | B2 | 5/2006 | Inukai | |
| 7,071,845 | B2 * | 7/2006 | Ivancic | 341/23 |
| 7,194,085 | B2 * | 3/2007 | Yamazaki et al. | 379/433.07 |
| 7,204,753 | B2 | 4/2007 | Ozaki et al. | |
| 7,489,777 | B2 * | 2/2009 | Yamazaki et al. | 379/433.07 |
| 2001/0013681 | A1 | 8/2001 | Bruzzese et al. | |
| 2001/0025881 | A1 | 10/2001 | Shepherd | |
| 2001/0040733 | A1 | 11/2001 | Toyoshima et al. | |
| 2002/0022509 | A1 | 2/2002 | Nicastro et al. | |
| 2002/0054030 | A1 * | 5/2002 | Murphy | 345/173 |
| 2002/0065132 | A1 | 5/2002 | Stephan | |
| 2002/0107075 | A1 | 8/2002 | Stephan | |
| 2002/0142825 | A1 | 10/2002 | Lark et al. | |
| 2002/0173354 | A1 | 11/2002 | Winans et al. | |
| 2003/0054868 | A1 | 3/2003 | Paulsen et al. | |
| 2003/0058233 | A1 * | 3/2003 | Ahn et al. | 345/211 |
| 2003/0064784 | A1 | 4/2003 | Wells et al. | |
| 2003/0069057 | A1 | 4/2003 | DeFrees-Parrott | |
| 2003/0069070 | A1 | 4/2003 | Alcorn et al. | |
| 2003/0216174 | A1 * | 11/2003 | Gauselmann | 463/30 |
| 2004/0152509 | A1 | 8/2004 | Hornik et al. | |
| 2004/0204204 | A1 * | 10/2004 | Brilliant et al. | 455/575.1 |
| 2005/0054438 | A1 | 3/2005 | Rothschild et al. | |
| 2005/0059458 | A1 | 3/2005 | Griswold et al. | |
| 2005/0059496 | A1 | 3/2005 | Hanchar | |
| 2005/0113163 | A1 | 5/2005 | Mattice et al. | |
| 2006/0062983 | A1 | 3/2006 | Irvin et al. | |
| 2007/0093290 | A1 | 4/2007 | Winans et al. | |

FOREIGN PATENT DOCUMENTS

| | | | |
|---|---|---|---|
| DE | 44 36 171 | | 4/1996 |
| DE | 44 36 171 | A1 * | 4/1996 |
| EP | 0134979 | A2 | 3/1985 |
| EP | 0769769 | A | 4/1997 |
| EP | JP 2000172444 | | 6/2000 |
| EP | 1 063 622 | A2 | 12/2000 |
| EP | 1063622 | | 12/2000 |
| EP | 1 074 935 | A2 | 2/2001 |
| EP | 1 081 633 | A2 | 3/2001 |
| EP | 1 083 531 | A1 | 3/2001 |
| EP | 1083531 | A | 3/2001 |
| EP | JP 2001076886 | | 3/2001 |
| EP | 1550987 | A2 | 7/2005 |
| GB | 2 251 112 | | 6/1992 |
| GB | 2 251 112 | A * | 6/1992 |
| GB | 2 294 571 | | 5/1996 |
| GB | 2 294 571 | A * | 5/1996 |
| JP | 59-184925 | | 10/1984 |
| JP | 05-046308 | | 2/1993 |
| JP | 2002-123363 | A * | 4/2002 |
| RU | 2060756 | | 5/1996 |
| RU | 2131141 | | 5/1999 |
| RU | 2161821 | | 1/2001 |
| RU | 2170947 | | 7/2001 |
| WO | WO 92/22864 | A1 * | 12/1992 |
| WO | WO 97/11448 | | 3/1997 |
| WO | WO 97/41677 | A1 * | 11/1997 |
| WO | WO 98/03962 | | 1/1998 |
| WO | WO 00/55716 | | 9/2000 |
| WO | WO 00/55879 | | 9/2000 |
| WO | WO 00/60669 | | 12/2000 |
| WO | WO 01/54384 | A1 * | 7/2001 |
| WO | WO 01/57579 | | 8/2001 |
| WO | WO 01/57579 | A2 | 8/2001 |
| WO | WO 0174464 | | 10/2001 |
| WO | WO 02/091319 | | 11/2002 |
| WO | WO 03/088164 | | 10/2003 |
| WO | WO 2005/034056 | | 4/2005 |
| WO | WO 2006/039070 | | 4/2006 |

OTHER PUBLICATIONS

Sharp Data Sheet LD-12610B for LCD Display LQ10D421, dated Jun. 30, 2000.*

International Search Report for Serial No. PCT/US02/09293 mailed Jan. 10, 2003.

Office Action dated Nov. 8, 2006 in Australian application No. 2002255924, 2 pages.

Office Action in corresponding EPO application No. 02 725 356.6 dated Dec. 12, 2006, European Patent Office, 6 pages.

European Patent Office (EPO); Extended European Search Report; Munich, Germany; Apr. 22, 2008.

USPTO Office Action mailed Oct. 5, 2005 in U.S. Appl. No. 10/139,801.

USPTO Final Office Action mailed Mar. 16, 2006 in U.S. Appl. No. 10/139,801.

USPTO Office Action mailed Jul. 6, 2006 in U.S. Appl. No. 10/139,801.

USPTO Final Office Action mailed Jan. 5, 2007 in U.S. Appl. No. 10/139,801.

USPTO Office Action mailed Jun. 4, 2007 in U.S. Appl. No. 10/139,801.

USPTO Final Office Action mailed Feb. 21, 2008 in U.S. Appl. No. 10/139,801.

USPTO Office Action mailed Aug. 20, 2008 in U.S. Appl. No. 10/139,801.

USPTO Office Action mailed Apr. 6, 2007 in U.S. Appl. No. 10/662,755.
USPTO Final Office Action mailed Oct. 11, 2007 in U.S. Appl. No. 10/662,755.
USPTO Office Action mailed Mar. 19, 2008 in U.S. Appl. No. 10/662,755.
USPTO Office Action mailed Jul. 30, 2008 in U.S. Appl. No. 10/955,679.
WIPO International Search Report, dated Aug. 14, 2003, mailed in related International Patent Application No. PCT/US02/13863, 4 pages.
WIPO International Search Report mailed Oct. 1, 2003 in related International Patent Application No. PCT/US02/09293 (491WO).
WIPO International Search Report mailed Dec. 17, 2004 in related International Patent Application No. PCT/US04/028540.
WIPO Written Opinion mailed Dec. 17, 2004 in International Patent Application No. PCT/US04/028540, 9 pages.
WIPO International Preliminary Examination Report mailed Mar. 23, 2006 in related International Patent Application No. PCT/US04/028540.
WIPO International Preliminary Report on Patentability mailed Jan. 25, 2006 in International Patent Application No. PCT/US05/031689.
WIPO International Search Report mailed Apr. 5, 2006 in International Patent Application No. PCT/US05/031689.
WIPO Written Opinion mailed Apr. 5, 2006 in International Patent Application No. PCT/US05/031689.
EPO Office Action dated Dec. 9, 2005, from European Application No. 02 725 894.6.
EPO European Examination Report, dated Dec. 1, 2007 from European Application No. 02 725 894.6.
EPO Office Action mailed Sep. 1, 2008 in European Application No. 08100588.6.
EPO Office Action mailed Jul. 27, 2006 in European Patent Application No. 04 782 934.6.
EPO Office Action mailed Jun. 23, 2008 in European Patent Application No. 04 782 934.6.
Australian Examiner's Report, dated Feb. 16, 2007, from related International Application No. 2002256429.
Universal Display Corporation, "Foled Flexible Organic Light Emitting Device", Apr. 25, 2002, <http://www.universaldisplay.com/foled.php>.
Universal Display Corporation, "From Passive to Active Matrix," Apr. 25, 2002, <http://www.universaldisplay.com/matrix.php>.
IBM, "Organic Light Emitting Diodes Project," Apr. 16, 2002, http://www.almaden.ibm.com/st/proiects/oleds/.
Kodak, "What It Is," Apr. 25, 2002 httr,://www.kodak.corn/US/en/corp/display/overeview.jhtml.
Rolltronics, By Dr. James Sheats, "Introduction to Organic Light-Emitting Diodes (OLEDs)," Apr. 16, 2002, http://www.rolltronics.com/intro_oled.htp.
"The IGT Experience: Slot Line Special show Edition 2002/2003," Global Gaming Expo G2E2002, Las Vegas Convention Center, Sep. 17-19, 2002, pp. 1-28.
Australian Office Action dated Feb. 10, 2009 from Application No. 2007234626; 1 pg.
European Oral Proceedings dated Mar. 15, 2009 from Application No. 08100588.6; 5 pgs.
Office Action dated Sep. 15, 2005 in Russian application No. 2004131668.
Decision on Grant dated Mar. 14, 2006 in Russian application No. 2004131668.
Examination Report dated Feb. 28, 2006 in Australian patent application No. 2002255924.

* cited by examiner

FIG. 10
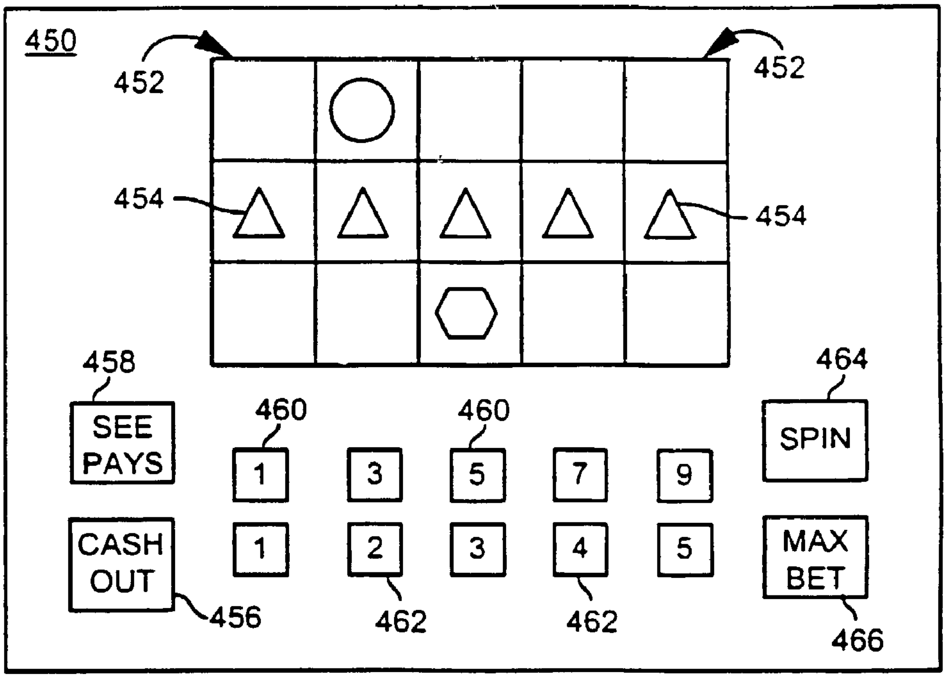
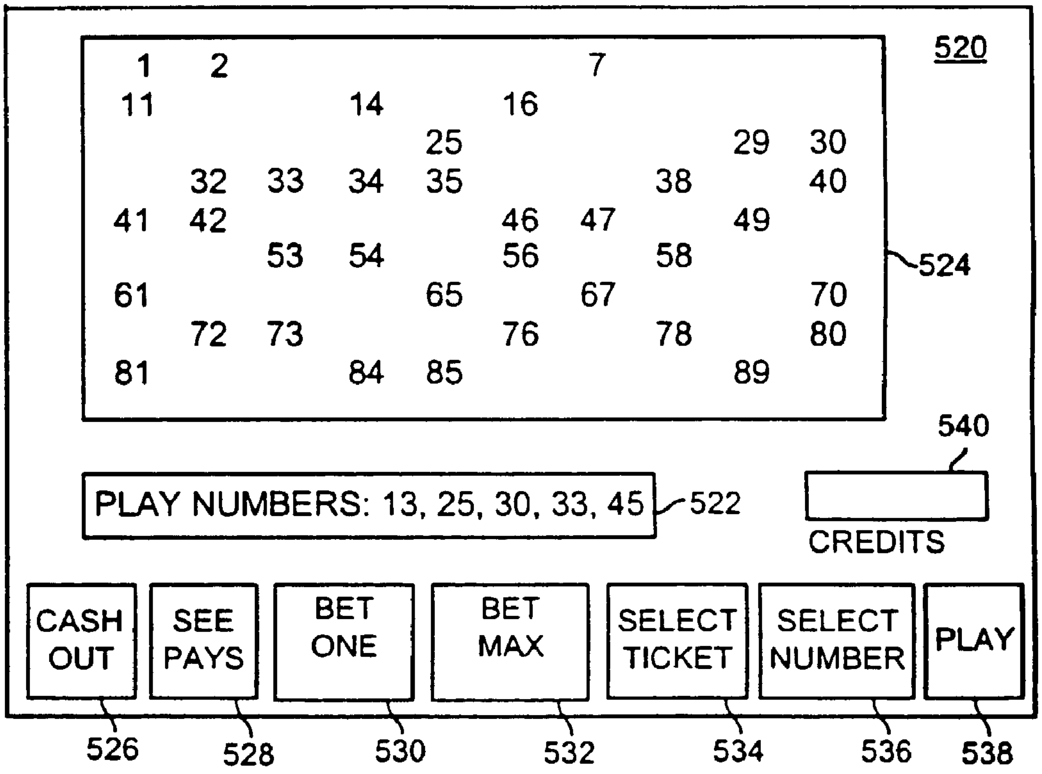
FIG. 11

SYSTEM FOR INTERFACING A USER AND A CASINO GAMING MACHINE

BACKGROUND

A video gaming machine employing both touch screen buttons and electromechanical buttons to permit a number of different games to be played on the same machine is disclosed in U.S. Pat. No. 5,342,047. The video gaming machine accepts inputs from both the touch screen and the electromechanical game buttons to control games played on the machine. In order to indicate the function of a touch screen or electromechanical button, each button is provided with an input label. The video gaming machine is capable of playing a number of different games. When the game being played changes, both the touch screen input labels and the electromechanical button labels may change under machine control.

In order to change the electromechanical button labels, each electromechanical button includes a translucent label, two light filters, and two light sources. The translucent label is etched with labels having indicia that are responsive to two different colors of light. The light filters are placed below the translucent label. The two light sources are different colors. When one light source is energized, the translucent label displays one of the indicia. When the other light source is energized, the translucent label displays the other the indicia. In this manner, the video gaming machine may change the electromechanical button labels to correspond to the game displayed on the touch screen.

SUMMARY OF THE INVENTION

In accordance with a first aspect of the invention, a gaming apparatus is provided. The gaming apparatus may comprise a display unit, a value input device, a transparent touch screen surface, a transparent switch member, and a controller. The display unit may be capable of generating video images. The transparent touch screen surface may cover at least a portion of the display unit. The transparent switch may cover at least a portion of the touch screen surface. The transparent switch member may be structured to avoid contact with the transparent touch screen surface when the transparent switch member is in a first position, and the transparent switch member may be structured to contact the transparent touch screen surface when the transparent switch member is in a second position. The controller may be operatively coupled to the display unit, the value input device, and the transparent touch screen surface. The controller may include a processor and a memory operatively coupled to the processor. The controller may be programmed to cause an input indicator to be generated at the portion of the display unit covered by the transparent touch screen surface. In operation, the input indicator may be visible through the transparent switch. The input indicator may represent a portion of one of the following games: video poker, video blackjack, video slots, video keno or video bingo. The controller may also be programmed to receive an input signal generated in response to movement of the transparent switch member from the first position to the second position.

The transparent switch may comprise a polyurethane lens, a glass lens, or a pliable silicon membrane. The transparent switch may be structured to magnify the displayed input indicator. The display unit may comprise a liquid crystal display and/or a cathode ray tube. The controller may be programmed to cause the input indicator to depict a first image during play of a first casino game and a second image during play of a second casino game, wherein the first image is different than the second image, and the first casino game is different than the second casino game. Similarly, the controller may be programmed to cause the input indicator to depict a first image during a first game mode and a second image during play a second game mode, wherein the first image is different than the second image, and the first casino game is different than the second casino game. The controller may be programmed to cause the input indicator to change periodically. The transparent touch screen surface may be a resistive touch screen surface and/or a capacitive touch screen surface. The display unit may include a non-input portion, wherein the transparent touch screen surface does not cover the non-input portion. The gaming apparatus may also be connected to other gaming apparatuses via a network such as the Internet. The controller may be programmed to operate a game selected from the group of games consisting of video poker, video blackjack, video slots, video keno and video bingo.

In accordance with a second aspect of the invention, a gaming apparatus is provided. The gaming apparatus may include slot machine reels, a display unit, a value input device, a transparent touch screen surface, a transparent switch member, and a controller. The display unit that may be capable of generating video images. The transparent touch screen surface may cover at least a portion of the display unit. The transparent switch member may cover at least a portion of the touch screen surface. The transparent switch member may be structured to avoid contact with the transparent touch screen surface when the transparent switch member is in a first position. The transparent switch member may be structured to contact the transparent touch screen surface when the transparent switch member is in a second position. The controller may be operatively coupled to the slot machine reels, display unit, the value input device, and the transparent touch screen surface. The controller may include a processor and a memory operatively coupled to the processor. The controller may be programmed to cause an input indicator to be generated at the portion of the display unit covered by the transparent touch screen surface. The input indicator may be visible through the transparent switch member. The input indicator may represent a portion of a slots game. The controller may be programmed to receive an input signal generated in response to movement of the transparent switch member from the first position to the second position.

In accordance with a third aspect of the invention, a gaming apparatus is provided. The gaming apparatus may comprise a first display, a second display, a transparent touch screen surface, a transparent switch member, and a controller. The first and second displays may be capable of generating video images. The transparent touch screen surface may cover at least a portion of the display unit. The transparent switch may cover at least a portion of the touch screen surface and may provide tactile feedback when the transparent switch member is depressed by a human operator. The controller may be operatively coupled to the first display, the second display, and the transparent touch screen surface. The controller may include a processor and a memory operatively coupled to the processor. The controller may be programmed to cause the first display unit to display a first image associated with a casino game selected from the group of casino games consisting of video poker, video blackjack, video slots, video keno and video bingo. The controller may also be programmed to cause the second display unit to display a second image associated with the casino game. During operation, the second image may be visible through the transparent switch. The controller may also be programmed to receive an input signal from the transparent touch screen surface in response to a depression of the transparent switch.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

FIG. 10 is an illustration of an embodiment of a visual display that may be displayed during performance of the slots routine of FIG. 12;

FIG. 11 is an illustration of an embodiment of a visual display that may be displayed during performance of the video keno routine of FIG. 13;

DETAILED DESCRIPTION OF VARIOUS EMBODIMENTS

Although the following text sets forth a detailed description of numerous different embodiments of the invention, it should be understood that the legal scope of the invention is defined by the words of the claims set forth at the end of this patent. The detailed description is to be construed as exemplary only and does not describe every possible embodiment of the invention since describing every possible embodiment would be impractical, if not impossible. Numerous alternative embodiments could be implemented, using either current technology or technology developed after the filing date of this patent, which would still fall within the scope of the claims defining the invention.

It should also be understood that, unless a term is expressly defined in this patent using the sentence "As used herein, the term '_' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, it is not intended that the scope of any claim element be interpreted based on the application of 35 U.S.C. § 112, sixth paragraph.

Figure 1:
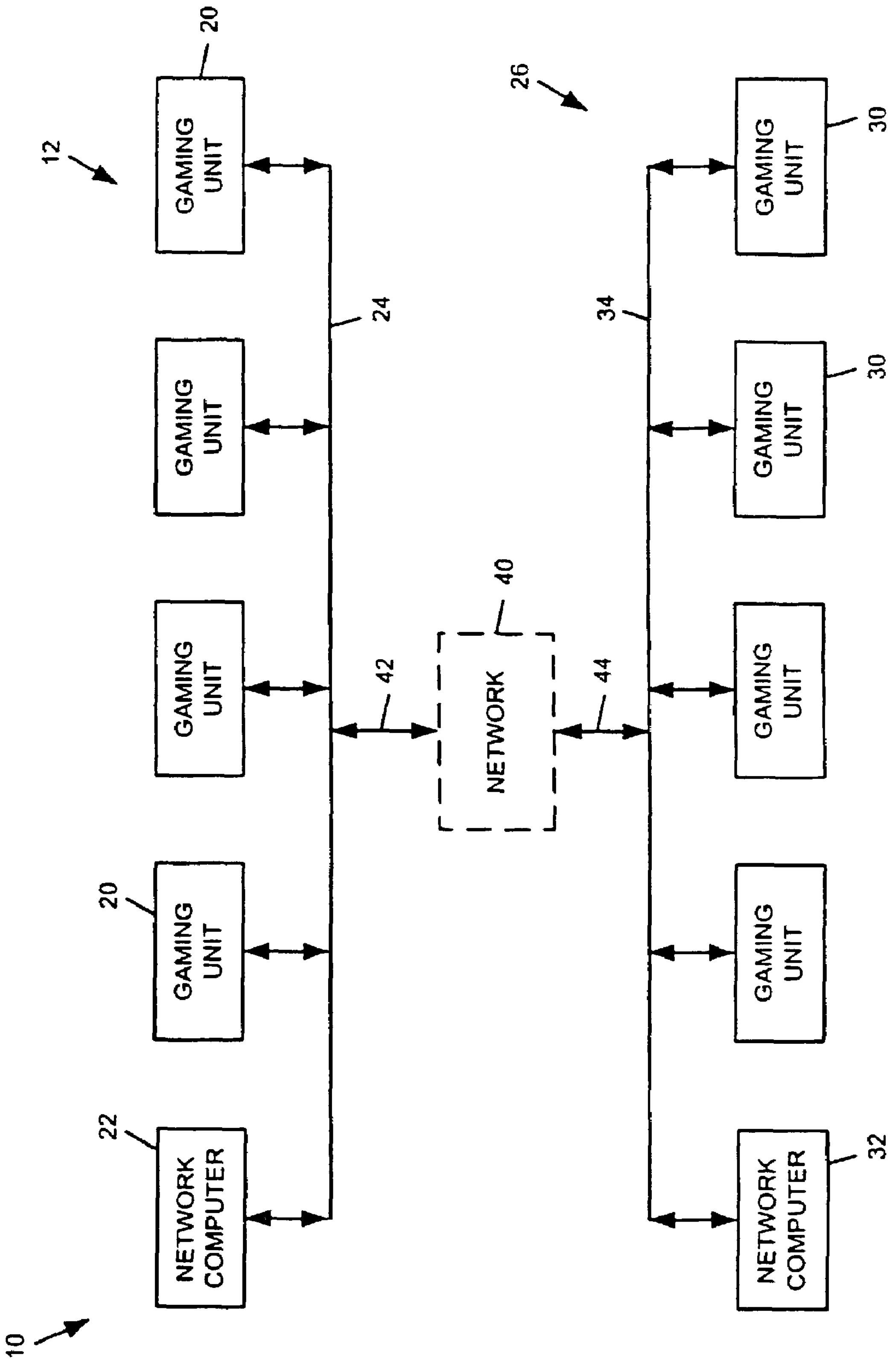
FIG. 1 is a block diagram of an embodiment of a gaming system in accordance with the invention.

FIG. 1 illustrates an embodiment of a casino gaming system 10 in accordance with the invention. In this embodiment, the casino gaming system 10 may include a first group or network 12 of casino gaming units 20 operatively coupled to a network computer 22 via a network data link or bus 24. The casino gaming system 10 may include a second group or network 26 of casino gaming units 30 operatively coupled to a network computer 32 via a network data link or bus 34. The first and second gaming networks 12, 26 may be operatively coupled to each other via a network 40, which may comprise, for example, the Internet, a wide area network (WAN), or a local area network (LAN) via a first network link 42 and a second network link 44.

The first network 12 of gaming units 20 may be provided in a first casino, and the second network 26 of gaming units 30 may be provided in a second casino located in a separate geographic location than the first casino. For example, the two casinos may be located in different areas of the same city, or they may be located in different states. The network 40 may include a plurality of network computers or server computers (not shown), each of which may be operatively interconnected. Where the network 40 comprises the Internet, data communication may take place over the communication links 42, 44 via an Internet communication protocol.

The network computer 22 may be a server computer and may be used to accumulate and analyze data relating to the operation of the gaming units 20. For example, the network computer 22 may continuously receive data from each of the gaming units 20 indicative of the dollar amount and number of wagers being made on each of the gaming units 20, data indicative of how much each of the gaming units 20 is paying out in winnings, data regarding the identity and gaming habits of players playing each of the gaming units 20, etc. The network computer 32 may be a server computer and may be used to perform the same or different functions in relation to the gaming units 30 as the network computer 22 described above.

Although each network 12, 26 is shown to include one network computer 22, 32 and four gaming units 20, 30, it should be understood that different numbers of computers and gaming units may be utilized. For example, the network 12 may include a plurality of network computers 22 and tens or hundreds of gaming units 20, all of which may be interconnected via the data link 24. The data link 24 may provided as a dedicated hardwired link or a wireless link. Although the data link 24 is shown as a single data link 24, the data link 24 may comprise multiple data links.

Figure 2:
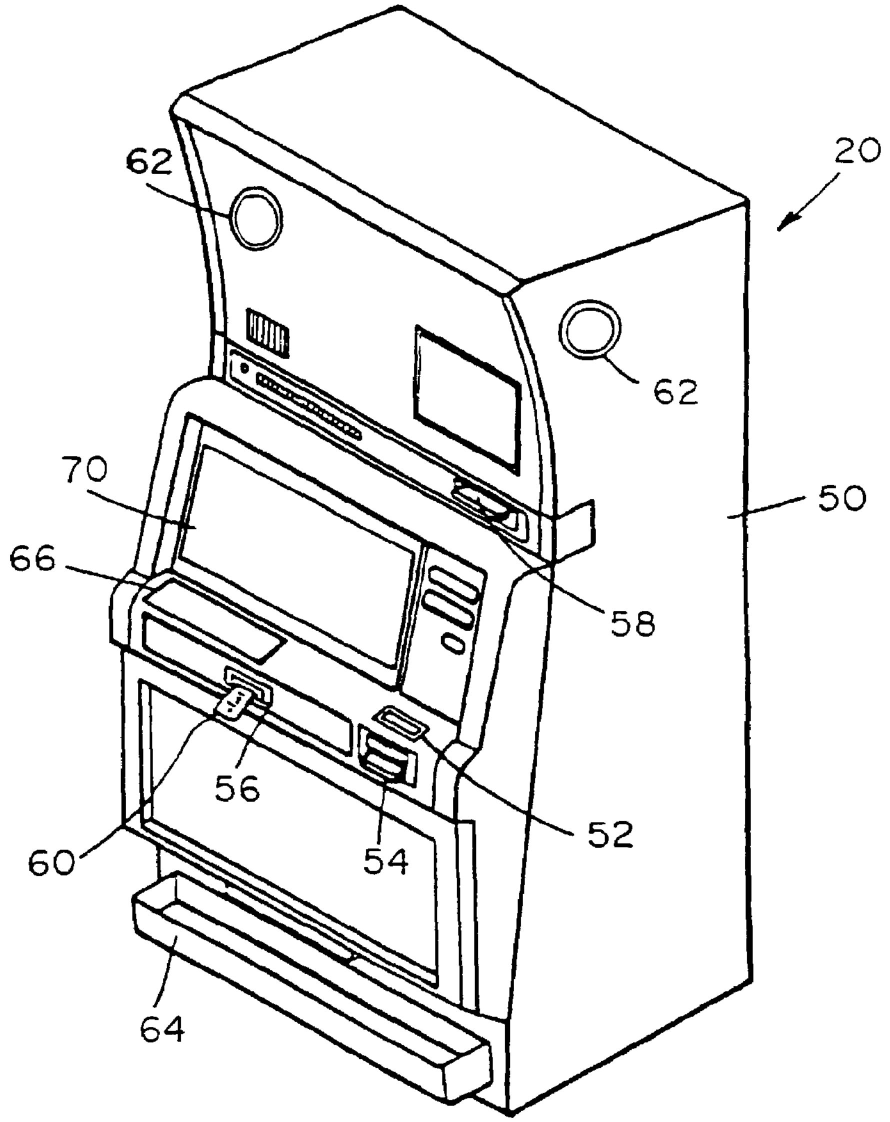
FIG. 2 is a perspective view of an embodiment of one of the gaming units shown schematically in FIG. 1.

FIG. 2 is a perspective view of one possible embodiment of one or more of the gaming units 20. Although the following description addresses the design of the gaming units 20, it should be understood that the gaming units 30 may have the same design as the gaming units 20 described below. It should be understood that the design of one or more of the gaming units 20 may be different than the design of other gaming units 20, and that the design of one or more of the gaming units 30 may be different than the design of other gaming units 30. Each gaming unit 20 may be any type of casino gaming unit and may have various different structures and methods of operation. For exemplary purposes, various designs of the gaming units 20 are described below, but it should be understood that numerous other designs may be utilized.

Referring to FIG. 2, the casino gaming unit 20 may include a housing or cabinet 50 and one or more input devices, which may include a coin slot or acceptor 52, a paper currency acceptor 54, a ticket reader/printer 56 and a card reader 58, which may be used to input value to the gaming unit 20. A value input device may include any device that can accept value from a customer. As used herein, the term "value" may encompass gaming tokens, coins, paper currency, ticket vouchers, credit or debit cards, and any other object representative of value.

If provided on the gaming unit 20, the ticket reader/printer 56 may be used to read and/or print or otherwise encode ticket vouchers 60. The ticket vouchers 60 may be composed of paper or another printable or encodable material and may have one or more of the following informational items printed or encoded thereon: the casino name, the type of ticket voucher, a validation number, a bar code with control and/or security data, the date and time of issuance of the ticket voucher, redemption instructions and restrictions, a description of an award, and any other information that may be necessary or desirable. Different types of ticket vouchers 60 could be used, such as bonus ticket vouchers, cash-redemption ticket vouchers, casino chip ticket vouchers, extra game play ticket vouchers, merchandise ticket vouchers, restaurant ticket vouchers, show ticket vouchers, etc. The ticket vouchers 60 could be printed with an optically readable material such as ink, or data on the ticket vouchers 60 could be magnetically encoded. The ticket reader/printer 56 may be provided with the ability to both read and print ticket vouchers 60, or it may be provided with the ability to only read or only print or encode ticket vouchers 60. In the latter case, for example, some of the gaming units 20 may have ticket printers 56 that may be used to print ticket vouchers 60, which could then be used by a player in other gaming units 20 that have ticket readers 56.

If provided, the card reader 58 may include any type of card reading device, such as a magnetic card reader or an optical card reader, and may be used to read data from a card offered by a player, such as a credit card or a player tracking card. If provided for player tracking purposes, the card reader 58 may be used to read data from, and/or write data to, player tracking cards that are capable of storing data representing the identity of a player, the identity of a casino, the player's gaming habits, etc.

The gaming unit 20 may include one or more audio speakers 62, a coin payout tray 64, an input control panel 66, and a main display unit 70. The audio speakers 62 may generate audio representing sounds such as the noise of spinning slot machine reels, a dealer's voice, music, announcements or any other audio related to a casino game. The main display unit 70 displays images relating to the game or games provided by the gaming unit 20. The main display unit 70 may be a color video display such as a liquid crystal display (LCD) or a cathode ray tube (CRT).

Figure 2A:
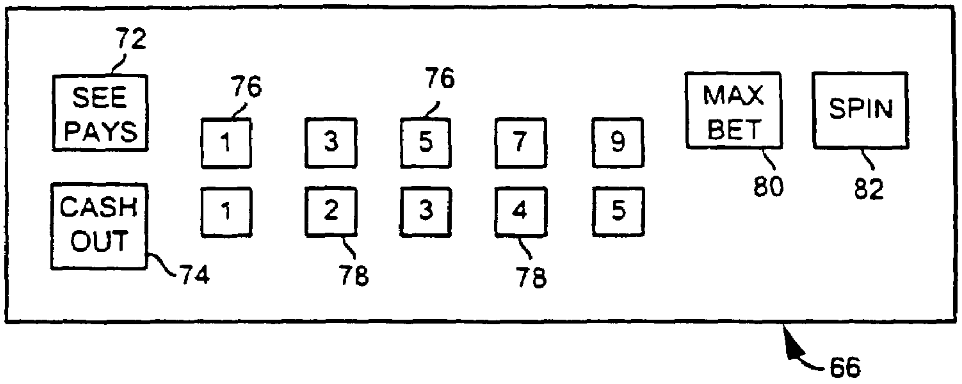
FIG. 2A illustrates an embodiment of a control panel for a gaming unit.

FIG. 2A illustrates one possible embodiment of the control panel 66, which may be used where the gaming unit 20 is a slot machine having a plurality of mechanical or "virtual" reels. The input control panel 66 may be provided with a plurality of buttons 72, 74, 76, 78, 80, 82. The buttons 72, 74, 76, 78, 80, 82 may be dynamic buttons and/or static buttons. The buttons 72, 74, 76, 78, 80, 82 may be activated by a player to select games, make wagers, make gaming decisions, etc. Although the control panel 66 is shown to be separate from the main display unit 70, it should be understood that the control panel 66 could be generated by the main display unit 70.

The control panel 66 may include a "See Pays" button 72 that, when activated, causes the main display unit 70 to generate one or more display screens showing the odds or payout information for the game or games provided by the gaming unit 20. In addition to the "See Pays" button, the control panel 66 may include a "Cash Out" button 74 that may be activated when a player decides to terminate play on the gaming unit 20, in which case the gaming unit 20 may return value to the player, such as by returning a number of coins to the player via the payout tray 64.

If the gaming unit 20 provides a slots game having a plurality of reels and a plurality of paylines which define winning combinations of reel symbols, the control panel 66 may be provided with a plurality of selection buttons 76, each of which allows the player to select a different number of paylines prior to spinning the reels. For example, five buttons 76 may be provided, each of which may allow a player to select one, three, five, seven or nine paylines. In addition, the control panel 66 may be provided with a plurality of selection buttons 78 each of which allows a player to specify a wager amount for each payline selected. For example, if the smallest wager accepted by the gaming unit 20 is a quarter ($0.25), the gaming unit 20 may be provided with five selection buttons 78, each of which may allow a player to select one, two, three, four or five quarters to wager for each payline selected. In that case, if a player were to activate the "5" button 76 (meaning that five paylines were to be played on the next spin of the reels) and then activate the "3" button 78 (meaning that three coins per payline were to be wagered), the total wager would be $3.75 (assuming the minimum bet was $0.25).

The control panel 66 may include a "Max Bet" button 80 to allow a player to make the maximum wager allowable for a game. In the above example, where up to nine paylines were provided and up to five quarters could be wagered for each payline selected, the maximum wager would be 45 quarters, or $11.25. The control panel 66 may include a spin button 82 to allow the player to initiate spinning of the reels of a slots game after a wager has been made.

In FIG. 2A, a rectangle is shown around the buttons 72, 74, 76, 78, 80, 82. It should be understood that that rectangle simply designates, for ease of reference, an area in which the buttons 72, 74, 76, 78, 80, 82 may be located. Consequently, the term "control panel" should not be construed to imply that a panel or plate separate from the housing 50 of the gaming unit 20 is required, and the term "control panel" may encompass a plurality or grouping of player activatable buttons. In one embodiment, each of the areas designated by a rectangle in FIG. 2A is a cutout area of a control panel cover. The control panel cover may hide unused portions of a display when one or more of the buttons 72, 74, 76, 78, 80, 82 is a dynamic button.

Although one possible control panel 66 is described above, it should be understood that different buttons could be utilized in the control panel 66, and that the particular buttons used may depend on the game or games that could be played on the gaming unit 20. In one embodiment, an input indicator may be generated inside one or more dynamic buttons which reflects a current game selection and/or a current game mode. The current game selection may be preprogrammed by the manufacturer, preprogrammed by a technician, and/or selected through interaction with a player. Examples of game selections include video poker, video blackjack, video slots, video keno, video bingo, and any other casino game. The current game mode may be determined by a controller and/or player interactions. Examples of game modes include demo mode, player attraction mode, game selection mode, wager mode, game play mode, payout mode, and any other mode of a casino game. In addition, the image of any dynamic button may be fixed and/or animated.

Figure 2B:
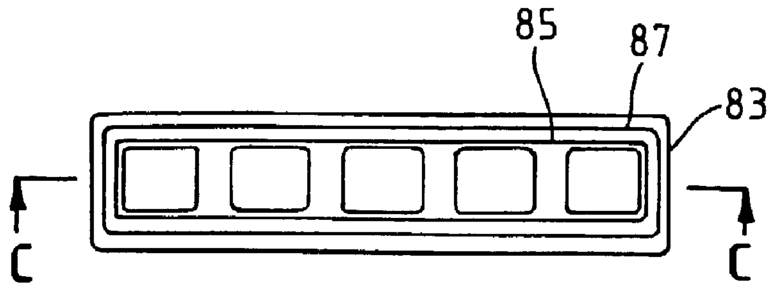
FIG. 2B is a top plan view of a plurality of dynamic buttons.
Figure 2C:
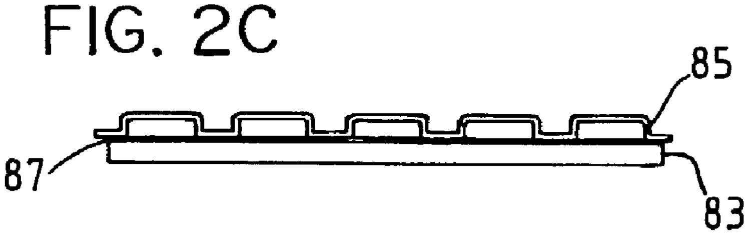
FIG. 2C is a cross-sectional view of the plurality of dynamic buttons taken along line C-C of FIG. 2B.

FIGS. 2B-2G illustrate a control panel embodiment analogous to the control panel 66. FIG. 2B is a top plan view of a plurality of dynamic buttons. FIG. 2C is a cross-sectional view of the plurality of dynamic buttons taken along line C-C of FIG. 2B. FIG. 2C is an exploded cross-sectional view of the plurality of dynamic buttons. Each dynamic button may include a display area 83, a tactile feedback portion 85, and an input detection portion 87.

The display area 83 may be some or all of a liquid crystal display (LCD) or a cathode ray tube (CRT) operatively connected to a controller as described in detail below. Of course, a person of ordinary skill in the art will readily appreciate that any type of flat screen display (e.g., plasma, VF, oled, etc.) and/or any other type of display (e.g., rear projection) may be used for the display area 83. The display area 83 may be an auxiliary display or a portion of the main display 70. For example, a pliable membrane switch array and a transparent touch-sensitive screen may be placed over a portion of the main display 70. In either case, the display may include a non-input portion, wherein the transparent touch screen surface does not cover the non-input portion.

The tactile feedback portion 85 may be a pliable silicon membrane, a plastic switch, a polyurethane lens, a glass lens, or any other input device which provides tactile feedback. The tactile feedback portion 85 may be transparent. In addition, the tactile feedback portion 85 may magnify underlying images. The input detection portion 87 may be resistive touch-sensitive screen, a capacitive touch-sensitive screen, a switch, or any other type of input device. If a touch-screen surface is used, the touch screen may be transparent. During operation, the display area 83 may be visible through the input detection portion 87 and the tactile feedback portion 85.

Figure 2D:
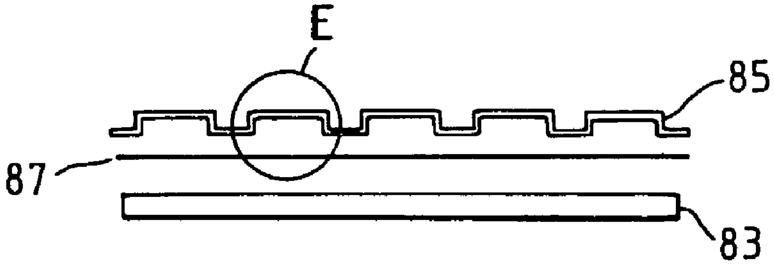
FIG. 2D is an exploded cross-sectional view of a plurality of dynamic buttons.
Figure 2E:
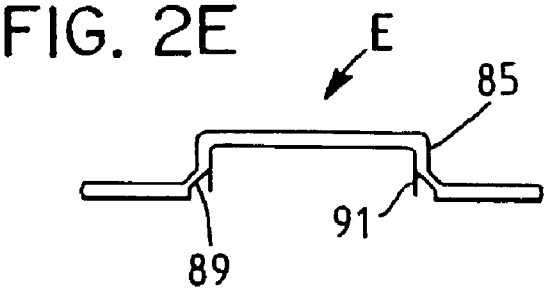
FIG. 2E is an enlarged fragmentary cross-sectional view of a tactile feedback portion taken about the circumscribed portion of FIG. 2D.

FIG. 2E is an enlarged fragmentary cross-sectional view of a tactile feedback portion 85 taken about the circumscribed portion E of FIG. 2D. In this embodiment, a molded hinge 89 provides the tactile feedback and returns the tactile feedback portion 85 to its original position after each depression. In addition, a touch screen contact 91 may be included in the tactile feedback portion 85. When the touch screen contact 91 touches the touch-sensitive screen 87, an input signal may be transmitted to the controller 100. In response, the image generated by the LCD at the location of the activated button (or any other display portion) may be changed.

Figure 2F:
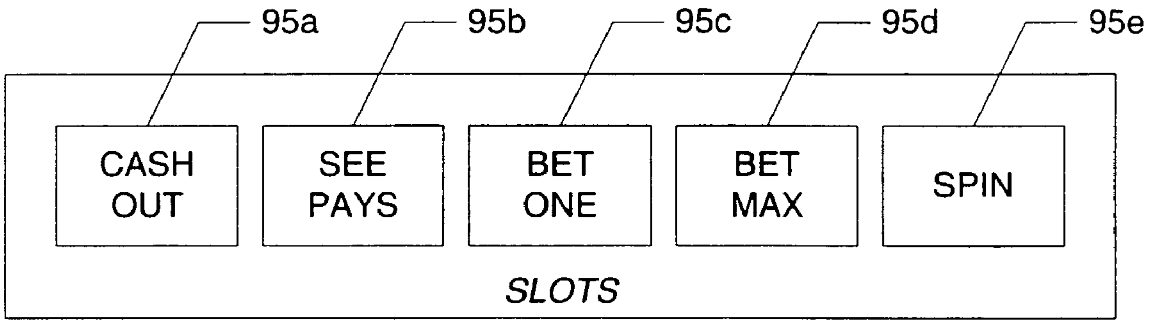
FIG. 2F is an illustration of an embodiment of buttons that may be displayed during performance of a video slots routine.
Figure 2G:
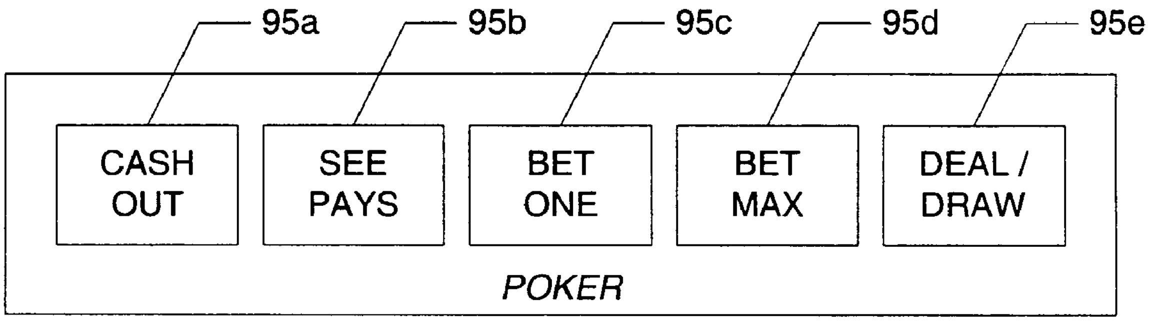
FIG. 2G is an illustration of an embodiment of buttons that may be displayed during performance of a video poker routine.

FIG. 2F is an illustration of an embodiment of buttons that may be displayed during performance of a video slots routine. In this embodiment, a "cash out" button 95*a*, a "see pays" button 95*b*, a "bet one" button 95*c*, a "bet max" button 95*d*, and a "spin" button 95*e* are displayed. The operation of these buttons is described in detail below. Some of these buttons 95*a*-95*e* may be static buttons, and some of these buttons 95*a*-95*e* may be dynamic buttons. FIG. 2G is an illustration of an embodiment of buttons that may be displayed during performance of a video poker routine. In this embodiment, buttons 95*a*-95*d* remain unchanged from the embodiment illustrated in FIG. 2F. However, because the game has changed from video slots to video poker, the "spin" button 95*e* may dynamically changed from "spin" to "deal/draw." In this manner, buttons with tactile feedback may be made to dynamically match the current game selection.

Gaming Unit Electronics

Figure 3:
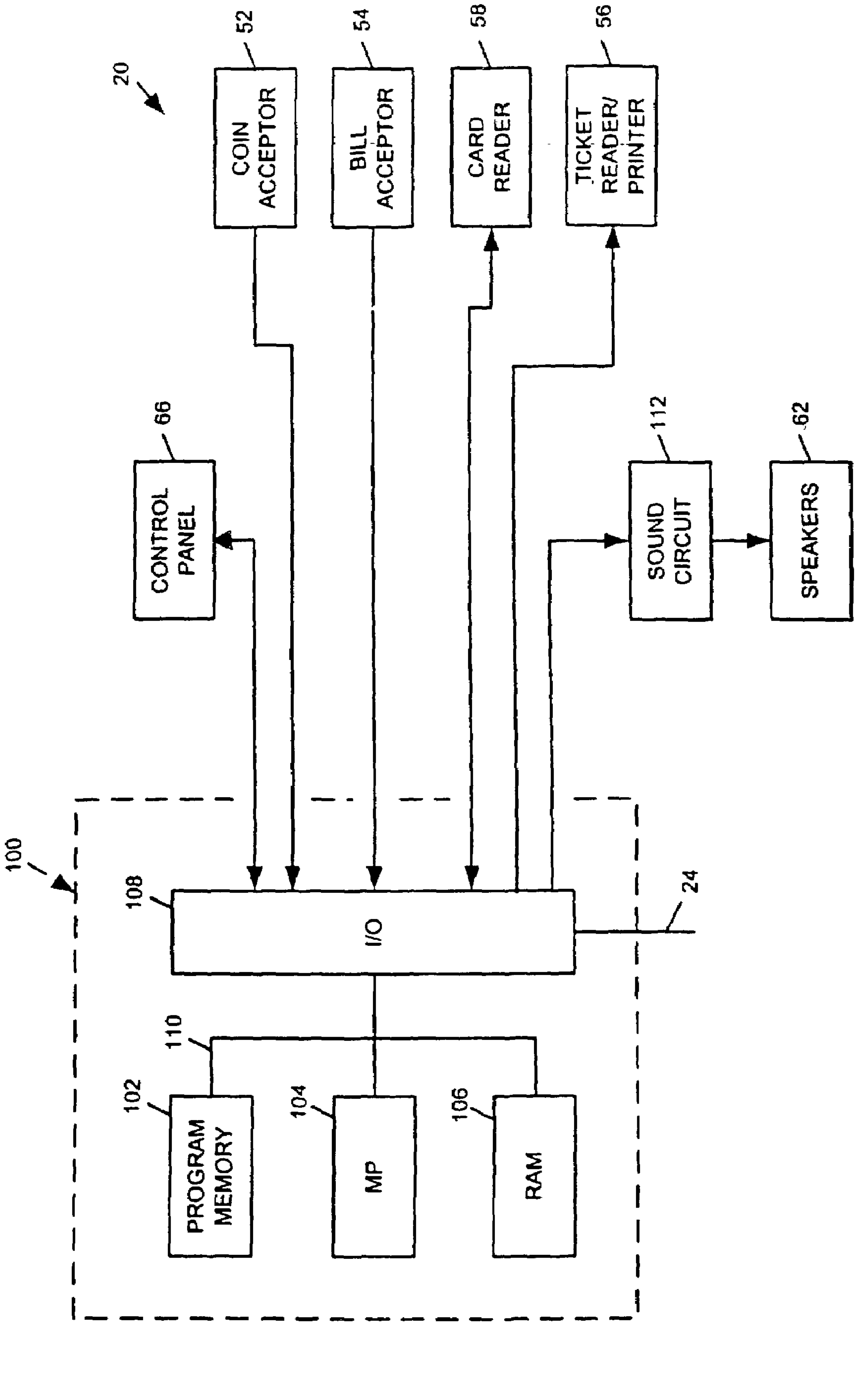
FIG. 3 is a block diagram of the electronic components of the gaming unit of FIG. 2.

FIG. 3 is a block diagram of a number of components that may be incorporated in the gaming unit 20. Referring to FIG. 3, the gaming unit 20 may include a controller 100 that may comprise a program memory 102, a microcontroller or microprocessor (MP) 104, a random-access memory (RAM) 106 and an input/output (I/O) circuit 108, all of which may be interconnected via an address/data bus 110. It should be appreciated that although only one microprocessor 104 is shown, the controller 100 may include multiple microprocessors 104. Similarly, the memory of the controller 100 may include multiple RAMs 106 and multiple program memories 102. Although the I/O circuit 108 is shown as a single block, it should be appreciated that the I/O circuit 108 may include a number of different types of I/O circuits. The RAM(s) 106 and program memories 102 may be implemented as semiconductor memories, magnetically readable memories, and/or optically readable memories, for example.

FIG. 3 illustrates that the control panel 66, the coin acceptor 52, the bill acceptor 54, the card reader 58 and the ticket reader/printer 56 may be operatively coupled to the I/O circuit 108, each of those components being so coupled by either a unidirectional or bidirectional, single-line or multiple-line data link, which may depend on the design of the component that is used. The speaker(s) 62 may be operatively coupled to a sound circuit 112, that may comprise a voice- and sound-synthesis circuit or that may comprise a driver circuit. The sound-generating circuit 112 may be coupled to the I/O circuit 108.

As shown in FIG. 3, the components 52, 54, 56, 58, 66, 112 may be connected to the I/O circuit 108 via a respective direct line or conductor. Different connection schemes could be used. For example, one or more of the components shown in FIG. 3 may be connected to the I/O circuit 108 via a common bus or other data link that is shared by a number of components. Furthermore, some of the components may be directly connected to the microprocessor 104 without passing through the I/O circuit 108.

During operation of a dynamic tactile button, the controller 100 may send image data for display on the display area 83 of the button and receive input signals from the input detection portion 87 of the button when a user depresses the transparent tactile feedback portion 85 of the button. Consequently, the two different sets of button images shown in FIGS. 2F and 2G may be generated at different times using the same physical structure.

Overall Operation of Gaming Unit

One manner in which one or more of the gaming units 20 (and one or more of the gaming units 30) may operate is described below in connection with a number of flowcharts which represent a number of portions or routines of one or more computer programs, which may be stored in one or more of the memories of the controller 100. The computer program(s) or portions thereof may be stored remotely, outside of the gaming unit 20, and may control the operation of the gaming unit 20 from a remote location. Such remote control may be facilitated with the use of a wireless connection, or by an Internet interface that connects the gaming unit 20 with a remote computer (such as one of the network computers 22, 32) having a memory in which the computer program portions are stored. The computer program portions may be written in any high level language such as C, C+, C++ or the like or any low-level, assembly or machine language. By storing the computer program portions therein, various portions of the memories 102, 106 are physically and/or structurally configured in accordance with computer program instructions.

Figure 4:
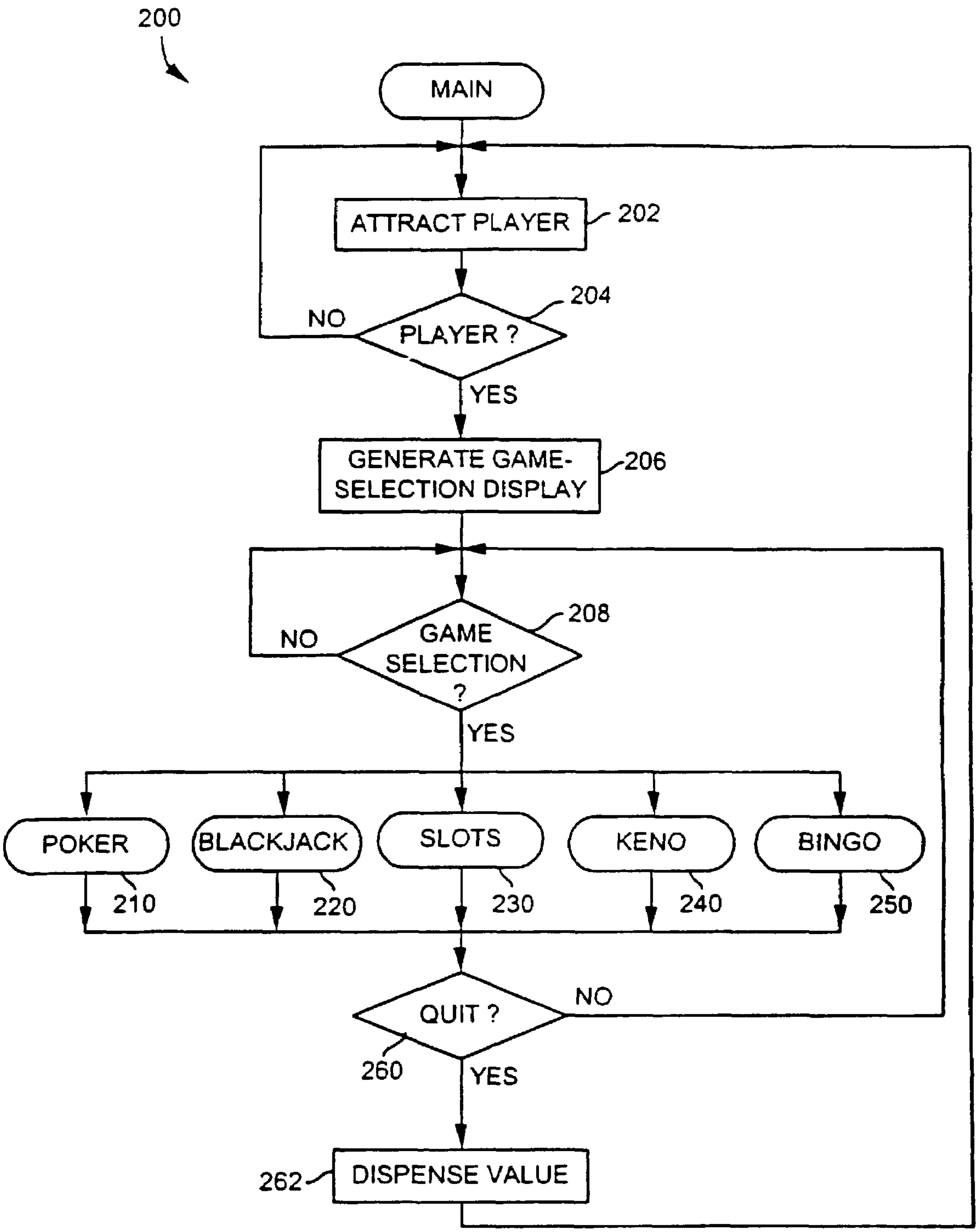
FIG. 4 is a flowchart of an embodiment of a main routine that may be performed during operation of one or more of the gaming units.

FIG. 4 is a flowchart of a main operating routine 200 that may be stored in the memory of the controller 100. Referring to FIG. 4, the main routine 200 may begin operation at block 202 during which an attraction sequence may be performed in an attempt to induce a potential player in a casino to play the gaming unit 20. The attraction sequence may be performed by displaying one or more video images on the main display unit 70, displaying one or more video images on the control panel 66, and/or causing one or more sound segments, such as voice or music, to be generated via the speakers 62. The attraction sequence may include a scrolling list of games that may be played on the gaming unit 20 and/or video images of various games being played, such as video poker, video blackjack, video slots, video keno, video bingo, etc. In one embodiment, a plurality of game selections are generated on a plurality of dynamic tactile buttons on the control panel 66.

During performance of the attraction sequence, if a potential player makes any input to the gaming unit 20 as determined at block 204, the attraction sequence may be terminated and a game-selection display may be generated on the main display unit 70 and/or a dynamic tactile button at block 206. The gaming unit 20 may detect an input at block 204 in various ways. For example, the gaming unit 20 could detect if the player presses any button on the gaming unit 20; the gaming unit 20 could determine if the player deposited one or more coins into the gaming unit 20; the gaming unit 20 could determine if player deposited paper currency into the gaming unit; etc.

The game-selection display generated at block 206 may include, for example, a list of video games that may be played on the gaming unit 20 and/or a visual message to prompt the player to deposit value into the gaming unit 20. While the game-selection display is generated, the gaming unit 20 may wait for the player to make a game selection. Upon selection of one of the games by the player as determined at block 208, the controller 100 may cause one of a number of game routines to be performed to allow the selected game to be played. For example, the game routines could include a video poker routine 210, a video blackjack routine 220, a slots routine 230, a video keno routine 240, and a video bingo routine 250. At block 208, if no game selection is made within a given period of time, the operation may branch back to block 202.

After one of the routines 210, 220, 230, 240, 250 has been performed to allow the player to play one of the games, block 260 may be utilized to determine whether the player wishes to terminate play on the gaming unit 20 or to select another game. If the player wishes to stop playing the gaming unit 20, which wish may be expressed, for example, by selecting a "Cash Out" button, the controller 100 may dispense value to the player at block 262 based on the outcome of the game(s) played by the player. The operation may then return to block 202. If the player did not wish to quit as determined at block 260, the routine may return to block 208 where the game-selection display may again be generated to allow the player to select another game.

It should be noted that although five gaming routines are shown in FIG. 4, a different number of routines could be included to allow play of a different number of games. The gaming unit 20 may also be programmed to allow play of different games.

Figure 5:
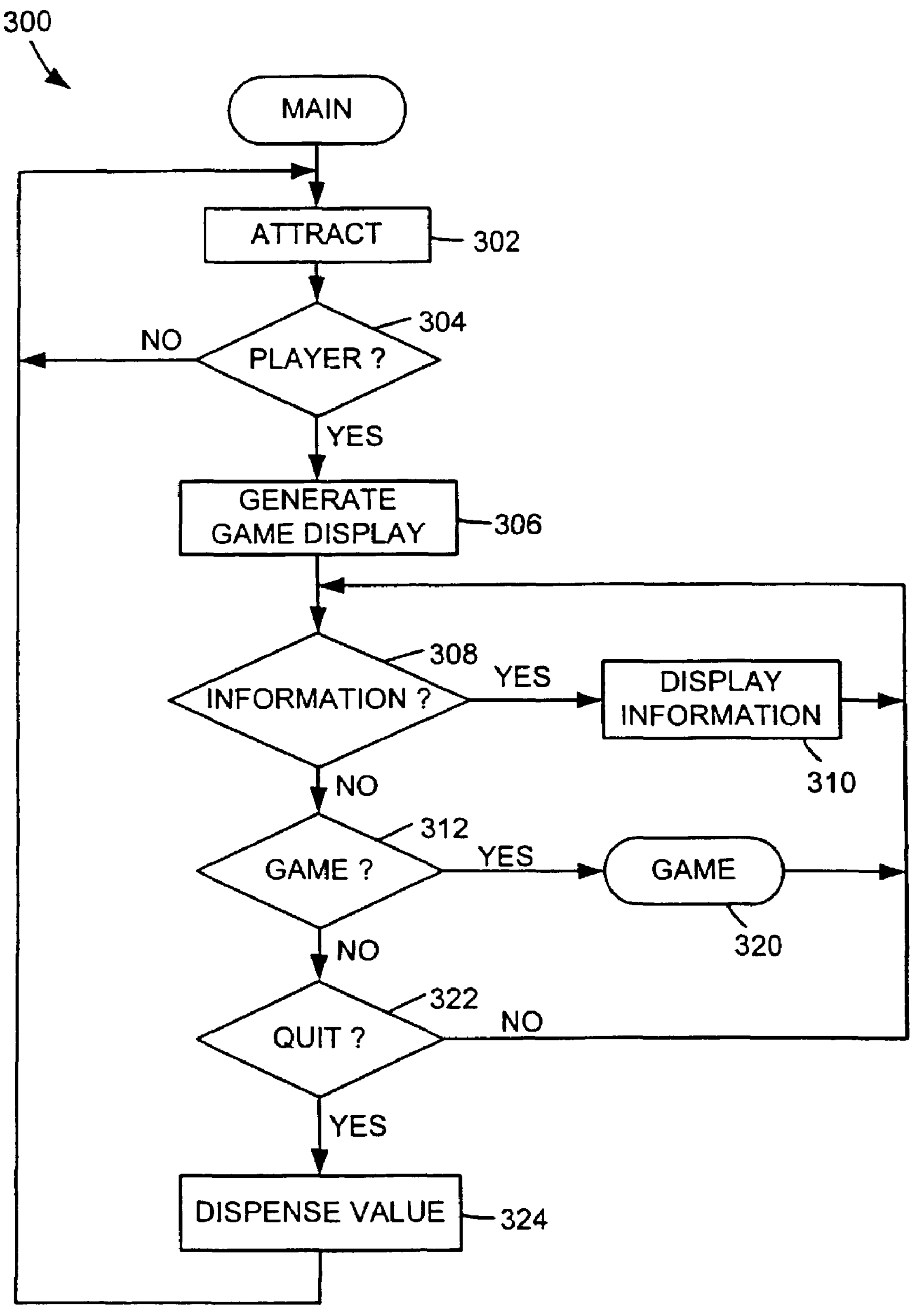
FIG. 5 is a flowchart of an alternative embodiment of a main routine that may be performed during operation of one or more of the gaming units.

FIG. 5 is a flowchart of an alternative main operating routine 300 that may be stored in the memory of the controller 100. The main routine 300 may be utilized for gaming units 20 that are designed to allow play of only a single game or single type of game. Referring to FIG. 5, the main routine 300 may begin operation at block 302 during which an attraction sequence may be performed in an attempt to induce a potential player in a casino to play the gaming unit 20. The attraction sequence may be performed by displaying one or more video images on the main display unit 70, displaying one or more video images on the control panel 66, and/or causing one or more sound segments, such as voice or music, to be generated via the speakers 62.

During performance of the attraction sequence, if a potential player makes any input to the gaming unit 20 as determined at block 304, the attraction sequence may be terminated and a game display may be generated on the main display unit 70 at block 306. The game display generated at block 306 may include, for example, an image of the casino game that may be played on the gaming unit 20 and/or a visual message to prompt the player to deposit value into the gaming unit 20. At block 308, the gaming unit 20 may determine if the player requested information concerning the game, in which case the requested information may be displayed at block 310. Block 312 may be used to determine if the player requested initiation of a game, in which case a game routine 320 may be performed. The game routine 320 could be any one of the game routines disclosed herein, such as one of the five game routines 210, 220, 230, 240, 250, or another game routine.

After the routine 320 has been performed to allow the player to play the game, block 322 may be utilized to determine whether the player wishes to terminate play on the gaming unit 20. If the player wishes to stop playing the gaming unit 20, which wish may be expressed, for example, by selecting a "Cash Out" button, the controller 100 may dispense value to the player at block 324 based on the outcome of the game(s) played by the player. The operation may then return to block 302. If the player did not wish to quit as determined at block 322, the operation may return to block 308.

Video Poker

Figure 6:
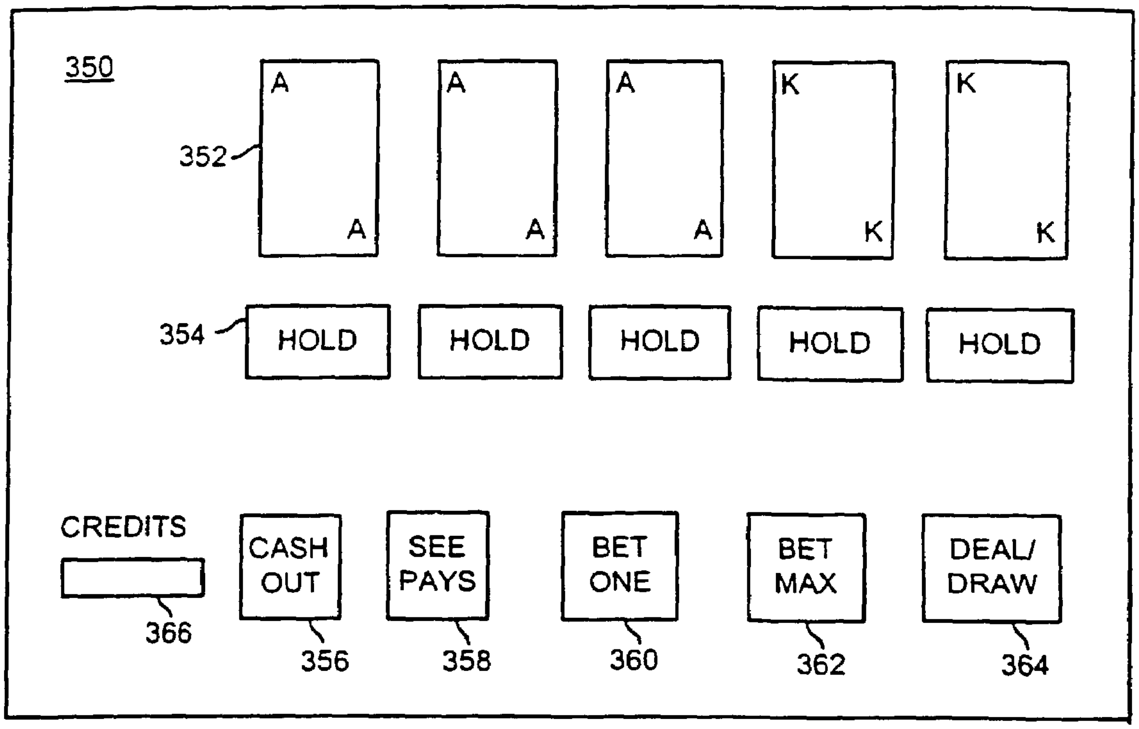
FIG. 6 is an illustration of an embodiment of a visual display that may be displayed during performance of the video poker routine of FIG. 8.

FIG. 6 is an exemplary display 350 that may be shown on the main display unit 70 during performance of the video poker routine 210 shown schematically in FIG. 4. Referring to FIG. 6, the display 350 may include video images 352 of a plurality of playing cards representing the player's hand, such as five cards. To allow the player to control the play of the video poker game, a plurality of player-selectable buttons may be displayed. The buttons may include a "Hold" button 354 disposed directly below each of the playing card images 352, a "Cash Out" button 356, a "See Pays" button 358, a "Bet One Credit" button 360, a "Bet Max Credits" button 362, and a "Deal/Draw" button 364. The display 350 may also include an area 366 in which the number of remaining credits or value is displayed. If the main display unit 70 is provided with a touch-sensitive screen, the buttons 354, 356, 358, 360, 362, 364 may form part of the video display 350. Alternatively, one or more of those buttons may be provided as part of a control panel that is provided separately from the main display unit 70.

Figure 8:
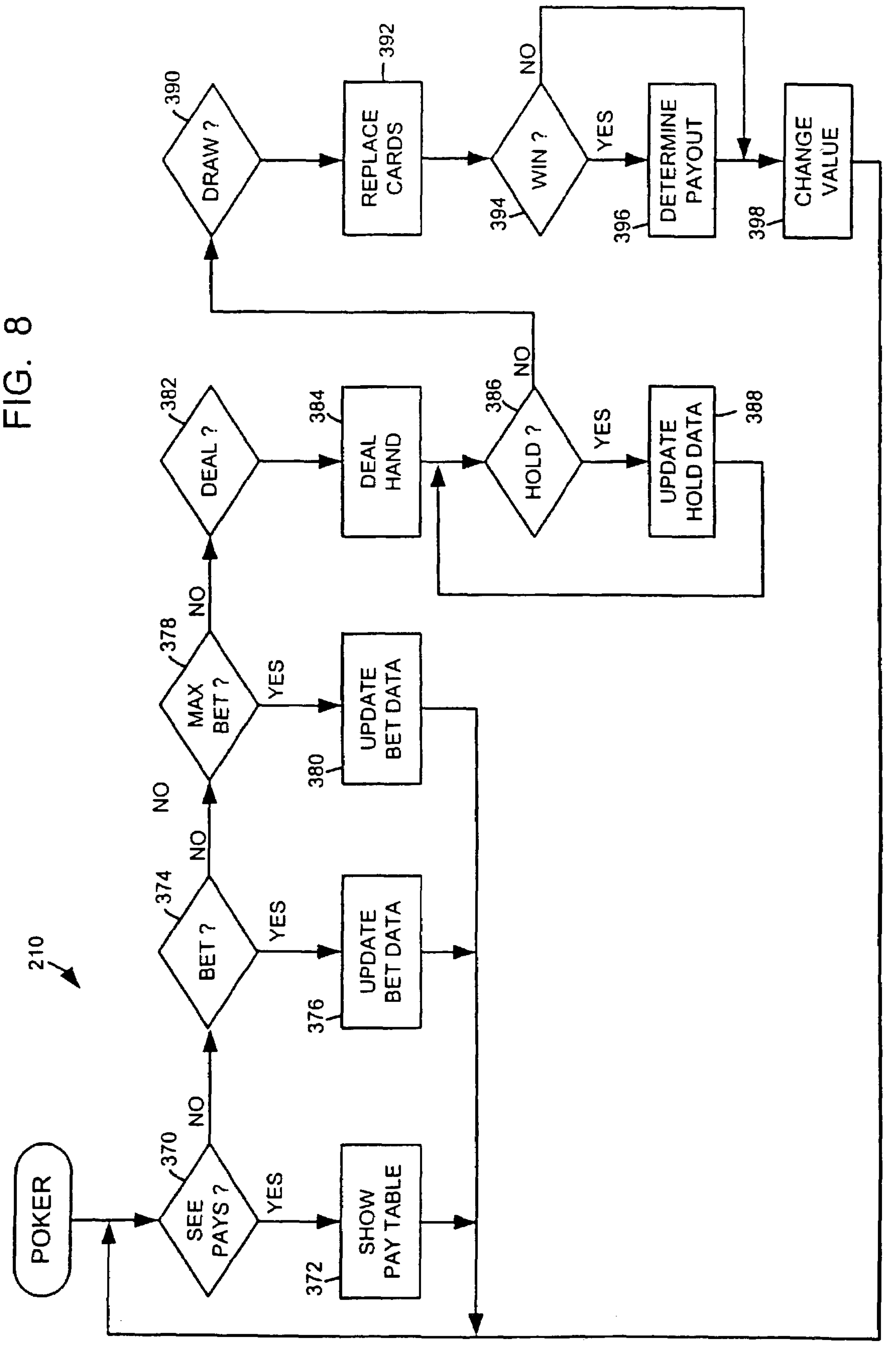
FIG. 8 is a flowchart of an embodiment of a video poker routine that may be performed by one or more of the gaming units.

FIG. 8 is a flowchart of the video poker routine 210 shown schematically in FIG. 4. Referring to FIG. 8, at block 370, the routine may determine whether the player has requested payout information, such as by activating the "See Pays" button 358, in which case at block 372 the routine may cause one or more pay tables to be displayed on the main display unit 70. At block 374, the routine may determine whether the player has made a bet, such as by pressing the "Bet One Credit" button 360, in which case at block 376 bet data corresponding to the bet made by the player may be stored in the memory of the controller 100. At block 378, the routine may determine whether the player has pressed the "Bet Max Credits" button 362, in which case at block 380 bet data corresponding to the maximum allowable bet may be stored in the memory of the controller 100.

At block 382, the routine may determine if the player desires a new hand to be dealt, which may be determined by detecting if the "Deal/Draw" button 364 was activated after a wager was made. In that case, at block 384 a video poker hand may be "dealt" by causing the main display unit 70 to generate the playing card images 352. After the hand is dealt, at block 386 the routine may determine if any of the "Hold" buttons 354 have been activated by the player, in which case data regarding which of the playing card images 352 are to be "held" may be stored in the controller 100 at block 388. If the "Deal/Draw" button 364 is activated again as determined at block 390, each of the playing card images 352 that was not "held" may be caused to disappear from the video display 350 and to be replaced by a new, randomly selected, playing card image 352 at block 392.

At block 394, the routine may determine whether the poker hand represented by the playing card images 352 currently displayed is a winner. That determination may be made by comparing data representing the currently displayed poker hand with data representing all possible winning hands, which may be stored in the memory of the controller 100. If there is a winning hand, a payout value corresponding to the winning hand may be determined at block 396. At block 398, the player's cumulative value or number of credits may be updated by subtracting the bet made by the player and adding, if the hand was a winner, the payout value determined at block 396. The cumulative value or number of credits may also be displayed in the display area 366 (FIG. 6).

Although the video poker routine 210 is described above in connection with a single poker hand of five cards, the routine 210 may be modified to allow other versions of poker to be played. For example, seven card poker may be played, or stud poker may be played. Alternatively, multiple poker hands may be simultaneously played. In that case, the game may begin by dealing a single poker hand, and the player may be allowed to hold certain cards. After deciding which cards to hold, the held cards may be duplicated in a plurality of different poker hands, with the remaining cards for each of those poker hands being randomly determined.

Video Blackjack

Figure 7:
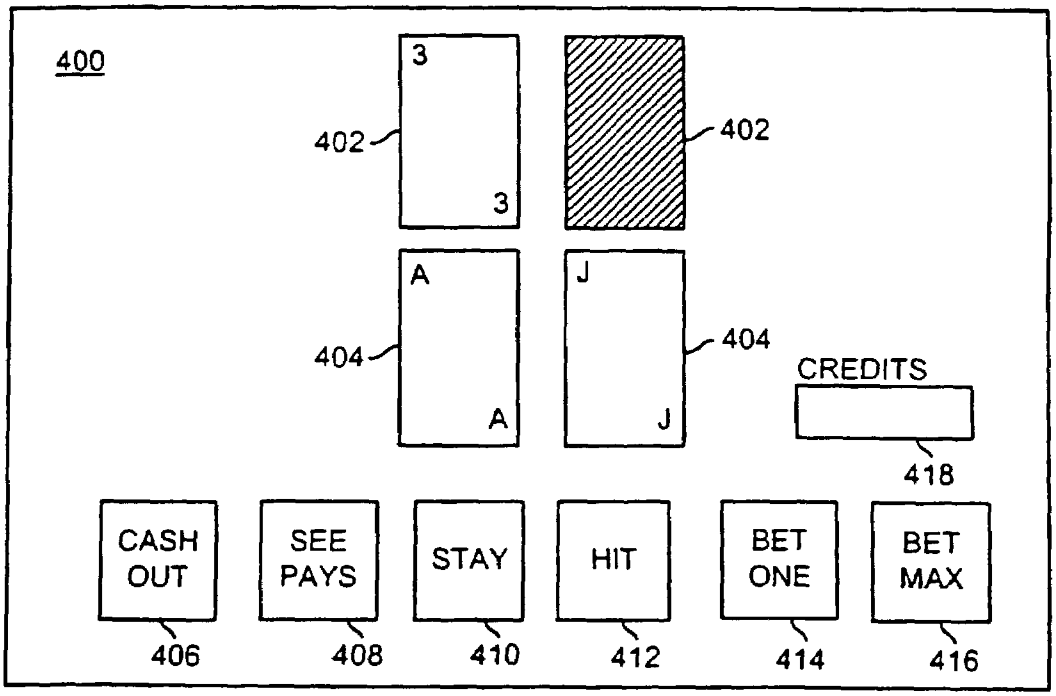
FIG. 7 is an illustration of an embodiment of a visual display that may be displayed during performance of the video blackjack routine of FIG. 9.

FIG. 7 is an exemplary display 400 that may be shown on the main display unit 70 during performance of the video blackjack routine 220 shown schematically in FIG. 4. Referring to FIG. 7, the display 400 may include video images 402 of a pair of playing cards representing a dealer's hand, with one of the cards shown face up and the other card being shown face down, and video images 404 of a pair of playing cards representing a player's hand, with both the cards shown face up. The "dealer" may be the gaming unit 20.

To allow the player to control the play of the video blackjack game, a plurality of player-selectable buttons may be displayed. The buttons may include a "Cash Out" button 406, a "See Pays" button 408, a "Stay" button 410, a "Hit" button 412, a "Bet One Credit" button 414, and a "Bet Max Credits" button 416. The display 400 may also include an area 418 in which the number of remaining credits or value is displayed. If the main display unit 70 is provided with a touch-sensitive screen, the buttons 406, 408, 410, 412, 414, 416 may form part of the video display 400. Alternatively, one or more of those buttons may be provided as part of a control panel that is provided separately from the main display unit 70.

Figure 9:
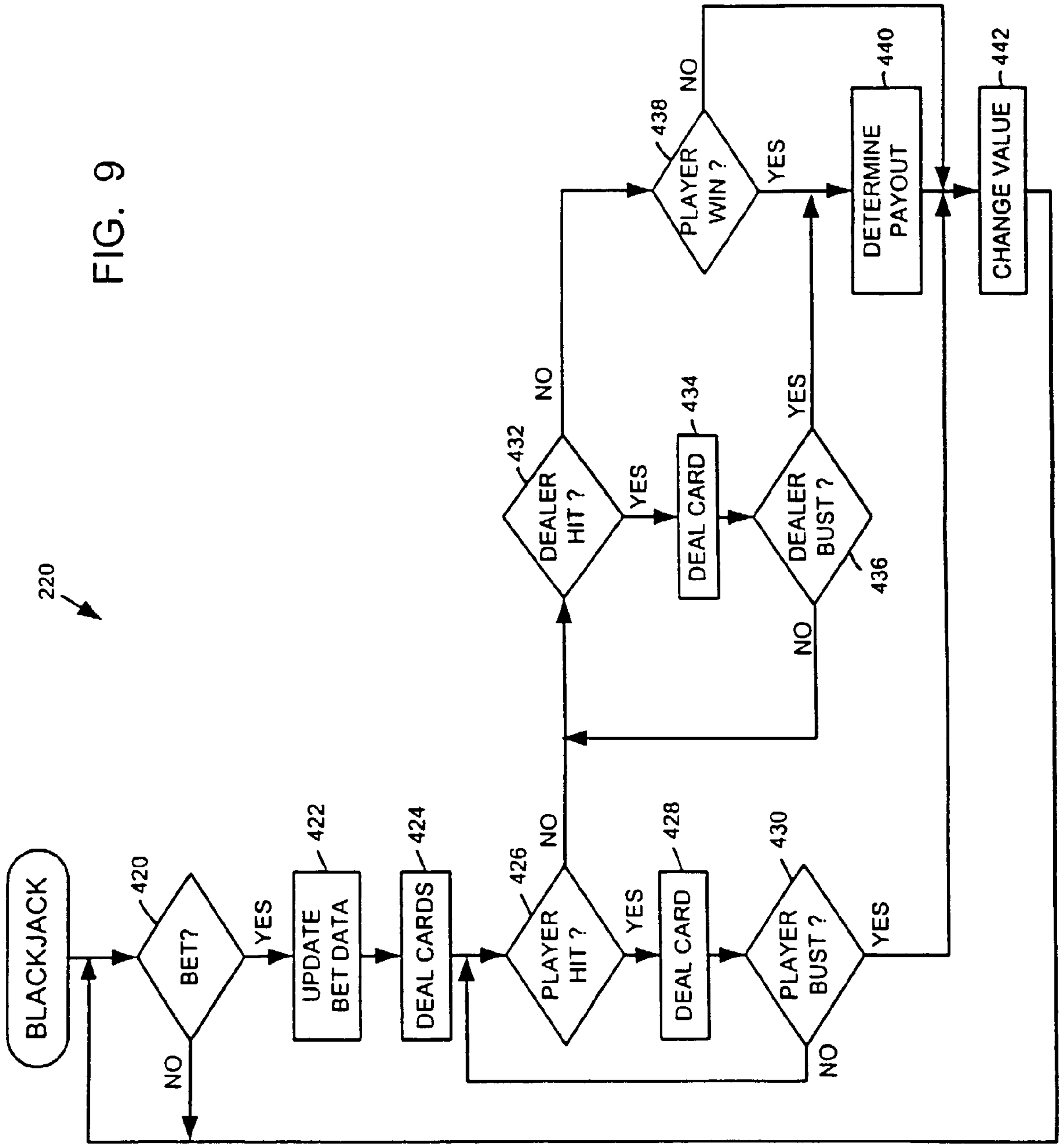
FIG. 9 is a flowchart of an embodiment of a video blackjack routine that may be performed by one or more of the gaming units.

FIG. 9 is a flowchart of the video blackjack routine 220 shown schematically in FIG. 4. Referring to FIG. 9, the video blackjack routine 220 may begin at block 420 where it may determine whether a bet has been made by the player. That may be determined, for example, by detecting the activation of either the "Bet One Credit" button 414 or the "Bet Max Credits" button 416. At block 422, bet data corresponding to the bet made at block 420 may be stored in the memory of the controller 100. At block 424, a dealer's hand and a player's hand may be "dealt" by making the playing card images 402, 404 appear on the main display unit 70.

At block 426, the player may be allowed to be "hit," in which case at block 428 another card will be dealt to the player's hand by making another playing card image 404 appear in the display 400. If the player is hit, block 430 may determine if the player has "bust," or exceeded 21. If the player has not bust, blocks 426 and 428 may be performed again to allow the player to be hit again.

If the player decides not to hit, at block 432 the routine may determine whether the dealer should be hit. Whether the dealer hits may be determined in accordance with predetermined rules, such as the dealer always hit if the dealer's hand totals 15 or less. If the dealer hits, at block 434 the dealer's hand may be dealt another card by making another playing card image 402 appear in the display 400. At block 436 the routine may determine whether the dealer has bust. If the dealer has not bust, blocks 432, 434 may be performed again to allow the dealer to be hit again.

If the dealer does not hit, at block 436 the outcome of the blackjack game and a corresponding payout may be determined based on, for example, whether the player or the dealer has the higher hand that does not exceed 21. If the player has a winning hand, a payout value corresponding to the winning hand may be determined at block 440. At block 442, the player's cumulative value or number of credits may be updated by subtracting the bet made by the player and adding, if the player won, the payout value determined at block 396. The cumulative value or number of credits may also be displayed in the display area 418 (FIG. 7).

Slots

FIG. 10 is an exemplary display 450 that may be shown on the main display unit 70 during performance of the slots routine 230 shown schematically in FIG. 4. Referring to FIG. 10, the display 450 may include video images 452 of a plurality of slot machine reels, each of the reels having a plurality of reel symbols 454 associated therewith. To allow the player to control the play of the slots game, a plurality of player-selectable buttons may be displayed. The buttons may include a "Cash Out" button 456, a "See Pays" button 458, a plurality of payline-selection buttons 460 each of which allows the player to select a different number of paylines prior to "spinning" the reels, a plurality of bet-selection buttons 462 each of which allows a player to specify a wager amount for each payline selected, a "Spin" button 464, and a "Max Bet" button 466 to allow a player to make the maximum wager allowable.

Figure 12:
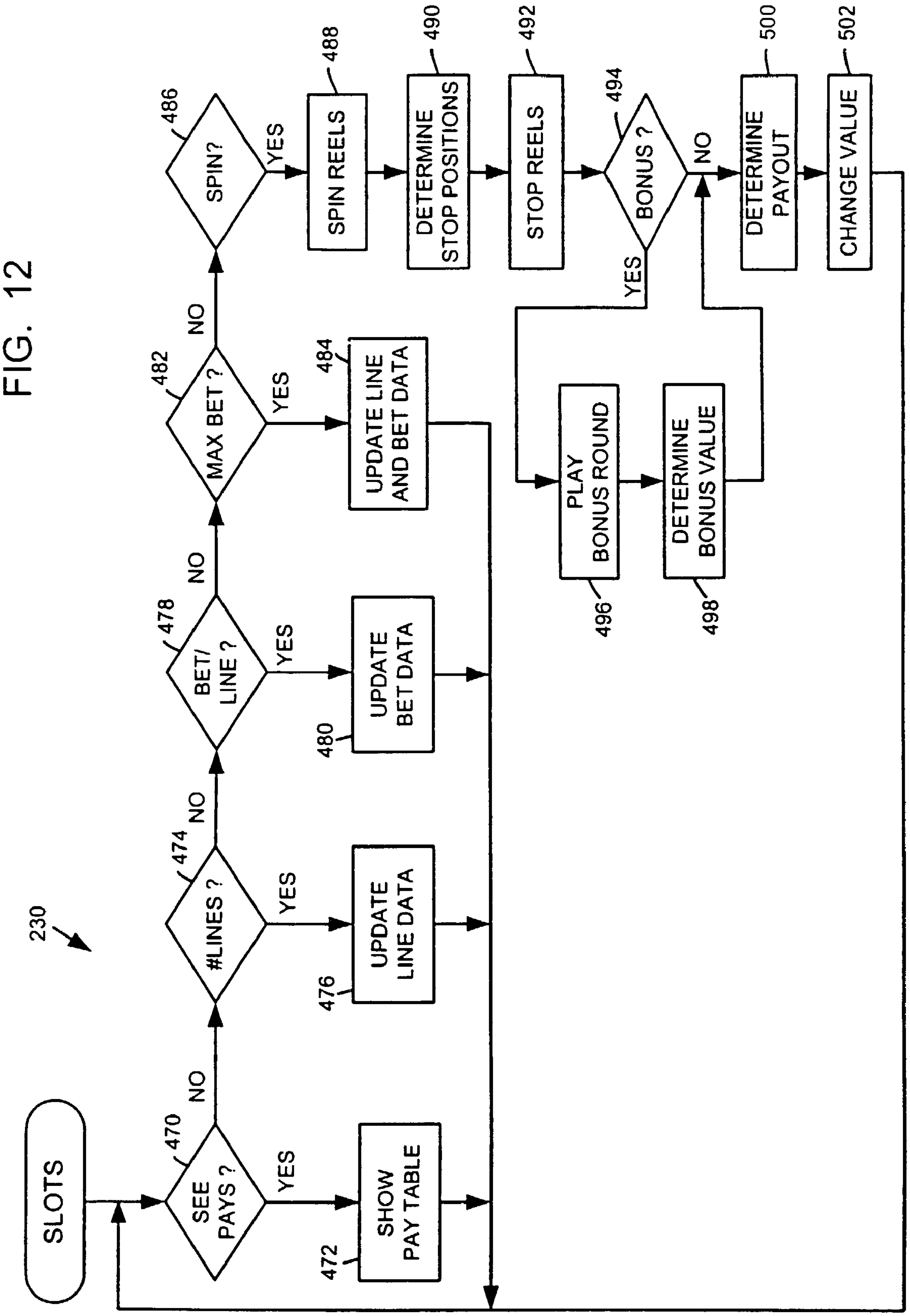
FIG. 12 is a flowchart of an embodiment of a slots routine that may be performed by one or more of the gaming units.

FIG. 12 is a flowchart of the slots routine 230 shown schematically in FIG. 10. Referring to FIG. 12, at block 470, the routine may determine whether the player has requested payout information, such as by activating the "See Pays" button 458, in which case at block 472 the routine may cause one or more pay tables to be displayed on the main display unit 70. At block 474, the routine may determine whether the player has pressed one of the payline-selection buttons 460, in which case at block 476 data corresponding to the number of paylines selected by the player may be stored in the memory of the controller 100. At block 478, the routine may determine whether the player has pressed one of the bet-selection buttons 462, in which case at block 480 data corresponding to the amount bet per payline may be stored in the memory of the controller 100. At block 482, the routine may determine whether the player has pressed the "Max Bet" button 466, in which case at block 484 bet data (which may include both payline data and bet-per-payline data) corresponding to the maximum allowable bet may be stored in the memory of the controller 100.

If the "Spin" button 464 has been activated by the player as determined at block 486, at block 488 the routine may cause the slot machine reel images 452 to begin "spinning" so as to simulate the appearance of a plurality of spinning mechanical slot machine reels. At block 490, the routine may determine the positions at which the slot machine reel images will stop, or the particular symbol images 454 that will be displayed when the reel images 452 stop spinning. At block 492, the routine may stop the reel images 452 from spinning by displaying stationary reel images 452 and images of three symbols 454 for each stopped reel image 452. The virtual reels may be stopped from left to right, from the perspective of the player, or in any other manner or sequence.

The routine may provide for the possibility of a bonus game or round if certain conditions are met, such as the display in the stopped reel images 452 of a particular symbol 454. If there is such a bonus condition as determined at block 494, the routine may proceed to block 496 where a bonus round may be played. The bonus round may be a different game than slots, and many other types of bonus games could be provided. If the player wins the bonus round, or receives additional credits or points in the bonus round, a bonus value may be determined at block 498. A payout value corresponding to outcome of the slots game and/or the bonus round may be determined at block 500. The payout value may depend on three-dimensional game options as described in detail below. At block 502, the player's cumulative value or number of credits may be updated by subtracting the bet made by the player and adding, if the slot game and/or bonus round was a winner, the payout value determined at block 500.

Video Keno

FIG. 11 is an exemplary display 520 that may be shown on the main display unit 70 during performance of the video keno routine 240 shown schematically in FIG. 4. Referring to FIG. 11, the display 520 may include a video image 522 of a plurality of numbers that were selected by the player prior to the start of a keno game and a video image 524 of a plurality of numbers randomly selected during the keno game. The randomly selected numbers may be displayed in a grid pattern.

To allow the player to control the play of the keno game, a plurality of player-selectable buttons may be displayed. The buttons may include a "Cash Out" button 526, a "See Pays" button 528, a "Bet One Credit" button 530, a "Bet Max Credits" button 532, a "Select Ticket" button 534, a "Select Number" button 536, and a "Play" button 538. The display 520 may also include an area 540 in which the number of remaining credits or value is displayed. If the main display unit 70 is provided with a touch-sensitive screen, the buttons may form part of the video display 520. Alternatively, one or more of those buttons may be provided as part of a control panel that is provided separately from the main display unit 70.

Figure 13:
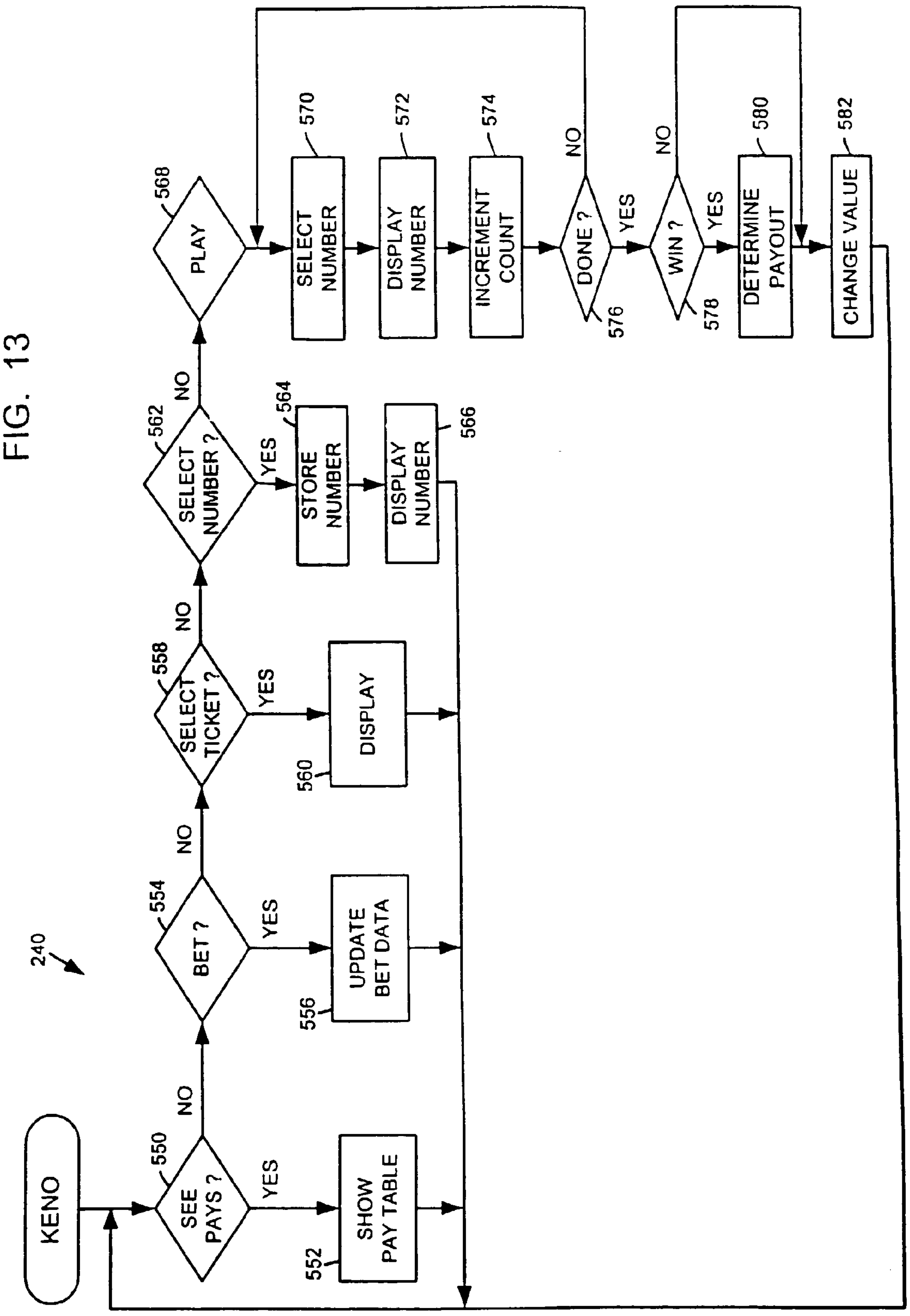
FIG. 13 is a flowchart of an embodiment of a video keno routine that may be performed by one or more of the gaming units.

FIG. 13 is a flowchart of the video keno routine 240 shown schematically in FIG. 4. The keno routine 240 may be utilized in connection with a single gaming unit 20 where a single player is playing a keno game, or the keno routine 240 may be utilized in connection with multiple gaming units 20 where multiple players are playing a single keno game. In the latter case, one or more of the acts described below may be performed either by the controller 100 in each gaming unit or by one of the network computer 22, 32 to which multiple gaming units 20 are operatively connected.

Referring to FIG. 13, at block 550, the routine may determine whether the player has requested payout information, such as by activating the "See Pays" button 528, in which case at block 552 the routine may cause one or more pay tables to be displayed on the main display unit 70. At block 554, the routine may determine whether the player has made a bet, such as by having pressed the "Bet One Credit" button 530 or the "Bet Max Credits" button 532, in which case at block 556 bet data corresponding to the bet made by the player may be stored in the memory of the controller 100. After the player has made a wager, at block 558 the player may select a keno ticket, and at block 560 the ticket may be displayed on the display 520. At block 562, the player may select one or more game numbers, which may be within a range set by the casino. After being selected, the player's game numbers may be stored in the memory of the controller 100 at block 564 and may be included in the image 522 on the display 520 at block 566. After a certain amount of time, the keno game may be closed to additional players (where a number of players are playing a single keno game using multiple gambling units 20).

If play of the keno game is to begin as determined at block 568, at block 570 a game number within a range set by the casino may be randomly selected either by the controller 100 or a central computer operatively connected to the controller, such as one of the network computers 22, 32. At block 572, the randomly selected game number may be displayed on the main display unit 70 and the display units 70 of other gaming units 20 (if any) which are involved in the same keno game. At block 574, the controller 100 (or the central computer noted above) may increment a count which keeps track of how many game numbers have been selected at block 570.

At block 576, the controller 100 (or one of the network computers 22, 32) may determine whether a maximum number of game numbers within the range have been randomly selected. If not, another game number may be randomly selected at block 570. If the maximum number of game numbers has been selected, at block 578 the controller 100 (or a central computer) may determine whether there are a sufficient number of matches between the game numbers selected by the player and the game numbers selected at block 570 to cause the player to win. The number of matches may depend on how many numbers the player selected and the particular keno rules being used.

If there are a sufficient number of matches, a payout may be determined at block 580 to compensate the player for winning the game. The payout may depend on the number of matches between the game numbers selected by the player and the game numbers randomly selected at block 570. At block 582, the player's cumulative value or number of credits may be updated by subtracting the bet made by the player and adding, if the keno game was won, the payout value determined at block 580. The cumulative value or number of credits may also be displayed in the display area 540 (FIG. 11).

Video Bingo

Figure 14:
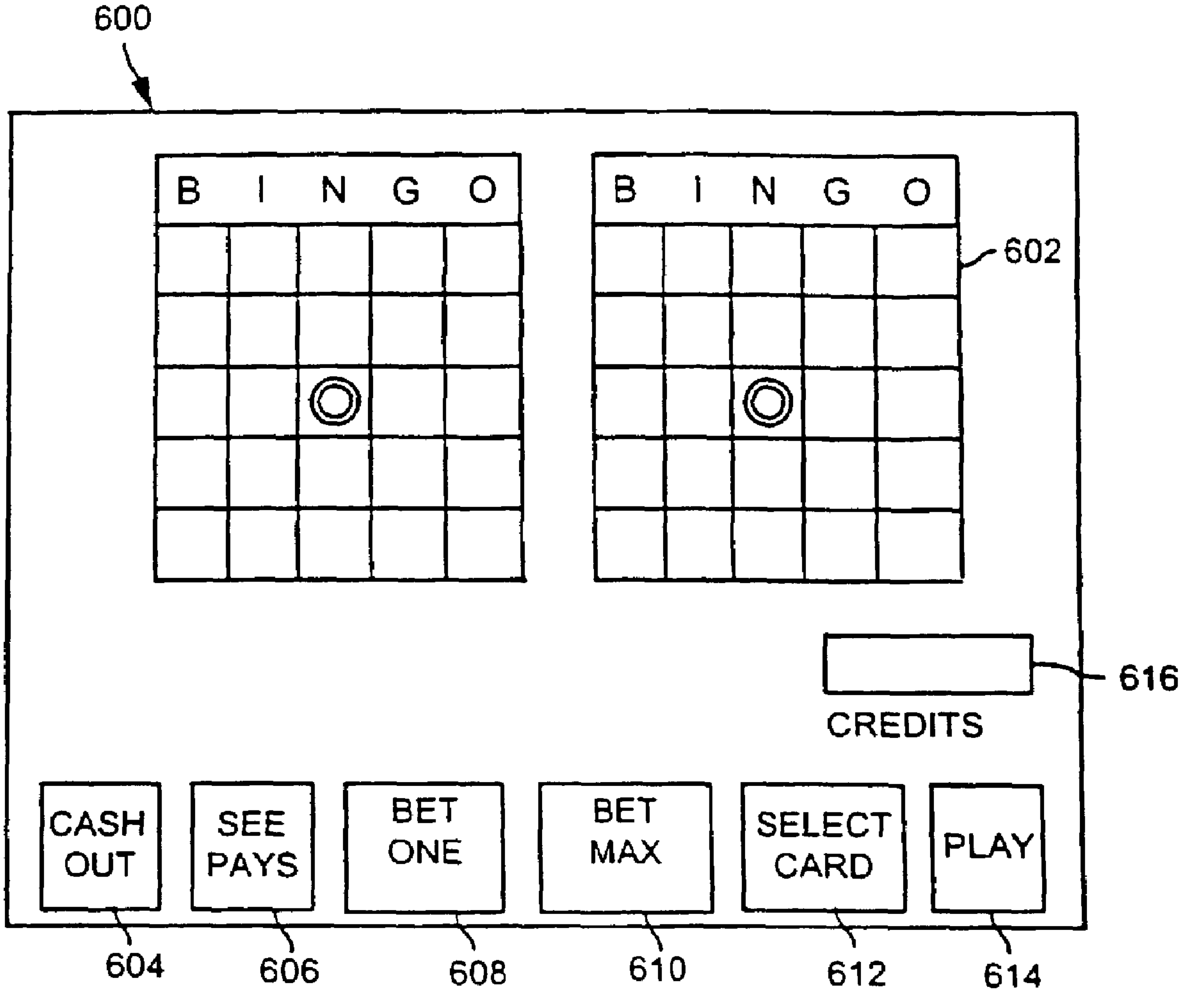
FIG. 14 is an illustration of an embodiment of a visual display that may be displayed during performance of the video bingo routine of FIG. 15.

FIG. 14 is an exemplary display 600 that may be shown on the main display unit 70 during performance of the video bingo routine 250 shown schematically in FIG. 4. Referring to FIG. 14, the display 600 may include one or more video images 602 of a bingo card and images of the bingo numbers selected during the game. The bingo card images 602 may have a grid pattern.

To allow the player to control the play of the bingo game, a plurality of player-selectable buttons may be displayed. The buttons may include a "Cash Out" button 604, a "See Pays" button 606, a "Bet One Credit" button 608, a "Bet Max Credits" button 610, a "Select Card" button 612, and a "Play" button 614. The display 600 may also include an area 616 in which the number of remaining credits or value is displayed. If the main display unit 70 is provided with a touch-sensitive screen, the buttons may form part of the video display 600. Alternatively, one or more of those buttons may be provided as part of a control panel that is provided separately from the main display unit 70.

Figure 15:
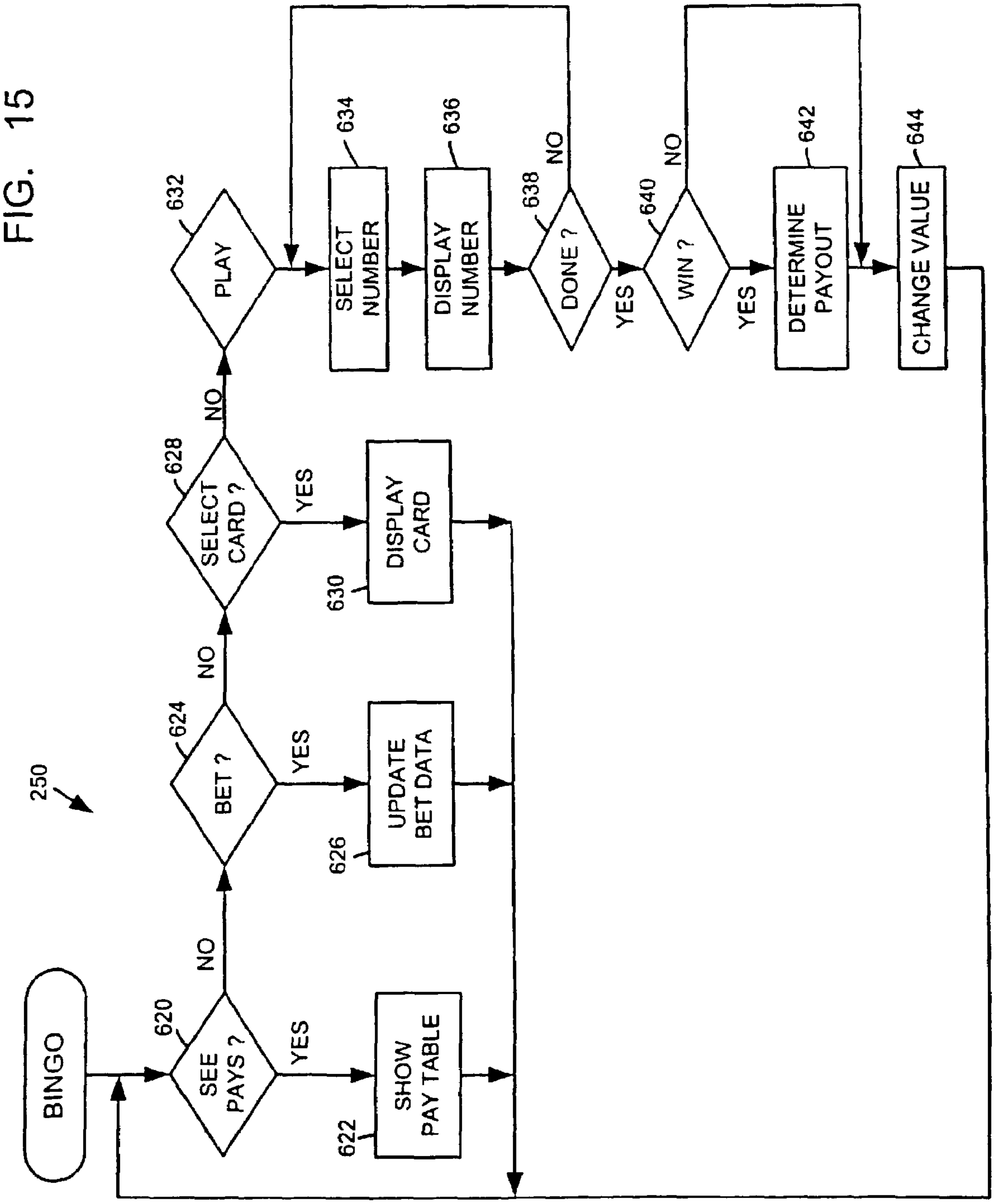
FIG. 15 is a flowchart of an embodiment of a video bingo routine that may be performed by one or more of the gaming units.

FIG. 15 is a flowchart of the video bingo routine 250 shown schematically in FIG. 4. The bingo routine 250 may be utilized in connection with a single gaming unit 20 where a single player is playing a bingo game, or the bingo routine 250 may be utilized in connection with multiple gaming units 20 where multiple players are playing a single bingo game. In the latter case, one or more of the acts described below may be performed either by the controller 100 in each gaming unit 20 or by one of the network computers 22, 32 to which multiple gaming units 20 are operatively connected.

Referring to FIG. 15, at block 620, the routine may determine whether the player has requested payout information, such as by activating the "See Pays" button 606, in which case at block 622 the routine may cause one or more pay tables to be displayed on the main display unit 70. At block 624, the routine may determine whether the player has made a bet, such as by having pressed the "Bet On Credit" button 608 or the "Bet Max Credits" button 610, in which case at block 626 bet data corresponding to the bet made by the player may be stored in the memory of the controller 100.

After the player has made a wager, at block 628 the player may select a bingo card, which may be generated randomly. The player may select more than one bingo card, and there may be a maximum number of bingo cards that a player may select. After play is to commence as determined at block 632, at block 634 a bingo number may be randomly generated by the controller 100 or a central computer such as one of the network computers 22, 32. At block 636, the bingo number may be displayed on the main display unit 70 and the display units 70 of any other gaming units 20 involved in the bingo game.

At block 638, the controller 100 (or a central computer) may determine whether any player has won the bingo game. If no player has won, another bingo number may be randomly selected at block 634. If any player has bingo as determined at block 638, the routine may determine at block 640 whether the player playing that gaming unit 20 was the winner. If so, at block 642 a payout for the player may be determined. The payout may depend on the number of random numbers that were drawn before there was a winner, the total number of winners (if there was more than one player), and the amount of money that was wagered on the game. At block 644, the player's cumulative value or number of credits may be updated by subtracting the bet made by the player and adding, if the bingo game was won, the payout value determined at block 642. The cumulative value or number of credits may also be displayed in the display area 616 (FIG. 14).

What is claimed is:

1. A casino gaming system comprising:

a plurality of casino gaming units located in a casino, the plurality of casino gaming units coupled to a communications network;

wherein each casino gaming unit in the plurality of casino gaming units comprises:

a main display unit for displaying an outcome to a wager-based game;

a value input device;

a control panel disposed below said main display unit designed or configured to receive inputs for making wagers and for making game decisions associated with a play of the wager-based game displayed on said main display unit, said control panel comprising;

a display unit that is capable of generating video images;

a transparent touch screen surface covering at least a portion of the display unit;

a plurality of transparent switch members for receiving the inputs associated with the play of at least a first wager-based game or the play of a second wager-based game wherein the plurality of transparent switch members are used to provide one or more different functions depending on whether the casino gaming unit is configured for the play of the first wager-based game or the play of the second wager-based game, each transparent switch member covering at least a portion of the touch screen surface, each transparent switch member being structured to avoid contact with the transparent touch screen surface when each transparent switch member is in a first position, each transparent switch member being structured to contact the transparent touch screen surface when each transparent switch member is in a second position, the transparent switch having a tactile feedback portion that protrudes above the transparent touch screen surface to provide tactile feedback when each transparent switch member is depressed by a human operator, each transparent switch member having a touch screen contact for electrically engaging the transparent touch screen surface in the second position, wherein the touch screen contact is located between the tactile feedback portion and the transparent touch screen surface; and a controller operatively coupled to the control panel, the value input device, and the transparent touch screen surface, the controller comprising a processor and a memory operatively coupled to the processor, the controller being programmed to receive from the control panel an input signal indicating a selection of the first wager-based game;

in response to receiving the selection of the first wager-based game, the controller being programmed to cause first video images for a first plurality of input indicators to be generated on the display unit, each of the first plurality of input indicators associated with one of the plurality of transparent switch members such that each of the first plurality of input indicators is visible through the one of the plurality of transparent switch members, said first plurality of input indicators for making the wagers and the game decisions associated with the first wager-based game, the controller being programmed to receive from the control panel an input signal indicating a selection of the second wager-based game;

in response to receiving the selection of the second wager-based game, the controller being programmed to cause second video images for a second plurality of input indicators to be generated on the display unit, said second plurality of input indicators different from said first plurality of input indicators, each of the said second plurality of input indicators associated with one of the plurality of transparent switch members such that each of the second plurality of input indicators is visible through the one of the plurality of transparent switch members, said second plurality of input indicators for making the wagers and the game decisions associated with the second wager-based game;

the controller being programmed to receive an input signal generated in response to movement of each transparent switch member from the first position to the second position the controller being programmed to determine a value payout associated with the outcome of a the wager-based game.

2. A casino gaming system as defined in claim 1, wherein the transparent switch member comprises a lens structured to magnify the input indicator.

3. A casino gaming system as defined in claim 2, wherein the lens comprises a glass lens.

4. A casino gaming system as defined in claim 2, wherein the lens comprises a polyurethane lens.

5. A casino gaming system as defined in claim 1, wherein the transparent switch member comprises a pliable silicon membrane.

6. A casino gaming system as defined in claim 1, wherein the display unit comprises at least one of a liquid crystal display and a cathode ray tube.

7. A casino gaming system as defined in claim 1, wherein the controller is further programmed to cause each of the first plurality of input indicator to depict a first image during a first mode of a casino game and a second image during a second mode of the casino game, the first image being different than the second image, the first mode being different than the second mode.

8. A casino gaming system as defined in claim 1, wherein the controller is further programmed to cause each of the first plurality input indicator to change periodically.

9. A casino gaming system as defined in claim 1, wherein the transparent touch screen surface comprises a resistive touch screen surface.

10. A casino gaming system as defined in claim 1, wherein the transparent touch screen surface comprises a capacitive touch screen surface.

11. A casino gaming system as defined in claim 1, wherein the display unit includes a non-input portion, wherein the transparent touch screen surface does not cover the non-input portion.

12. A casino gaming system as defined in claim 1, wherein the controller is further programmed to operate a game selected from the group of games consisting of video poker, video blackjack, video slots, video keno and video bingo.

13. A casino gaming system as defined in claim 1, wherein each transparent switch member comprises a plastic switch.

14. The casino gaming system of claim 1, wherein each transparent switch member comprises a molded hinge portion adjacent the tactile feedback portion.

15. A gaming apparatus comprising:

slot machine reels;

a value input device;

a control panel disposed below said slot machine reels designed or configured to receive inputs for making wagers and for making game decisions associated with a play of a wager-based game displayed on said slot machine reels, said control panel comprising;

a display unit that is capable of generating video images;

a transparent touch screen surface covering at least a portion of the display unit;

a plurality of transparent switch members for receiving the inputs associated with the play of at least a first wager-based game or the play of a second wager-based name wherein the plurality of transparent switch members are used to provide one or more different functions depending on whether the casino gaming unit is configured for the play of the first wager-based name or the play of the second wager-based game, each transparent switch member covering at least a portion of the touch screen surface, each transparent switch member being structured to avoid contact with the transparent touch screen surface when each transparent switch member is in a first position, each transparent switch member being structured to contact the transparent touch screen surface when each transparent switch member is in a second position, each transparent switch having a tactile feedback portion that protrudes above the transparent touch screen surface to provide tactile feedback when each transparent switch member is depressed by a human operator, each transparent switch member having a touch screen contact member extending from the tactile feedback portion for electrically engaging the transparent touch screen surface in the second position, wherein the touch screen contact member is located between the tactile feedback portion and the transparent touch screen surface; and a controller operatively coupled to the slot machine reels, the control panel, the value input device, and the transparent touch screen surface, the controller comprising a processor and a memory operatively coupled to the processor, the controller being programmed to receive from the control panel an input signal indicating a selection of the first wager-based game;

in response to receiving the selection of the first wager-based game, the controller being programmed to cause first video images for a first plurality of input indicators to be generated on the display unit each of the first plurality of input indicators associated with one of the plurality of input switch members such that each of the first plurality of input indicators is visible through the one of the plurality of input switch members, said first plurality of input indicators for making the wagers and the game decisions associated with the first wager-based game;

the controller being programmed to receive from the control panel an input signal indicating a selection of the second wager-based game;

in response to receiving the selection of the second wager-based game, the controller being programmed to cause second video images for a second plurality of input indicators to be generated on the display unit, said second plurality of input indicators different from said first plurality of input indicators, each of the said second plurality of input indicators associated with one of the plurality of transparent switch members such that each of the second plurality of input indicators is visible through the one of the plurality of transparent switch members, said second plurality of input indicators for making the wagers and the game decisions associated with the second wager-based game;

the controller being programmed to receive an input signal generated in response to movement of each transparent switch member from the first position to the second position, the controller being programmed to determine a value payout associated with an outcome of the slots game.

16. A gaming apparatus as defined in claim 15, wherein the transparent switch member comprises a lens structured to magnify the input indicator.

17. A gaming apparatus as defined in claim 16, wherein the lens comprises a glass lens.

18. A gaming apparatus as defined in claim 16, wherein the lens comprises a polyurethane lens.

19. A gaming apparatus as defined in claim 15, wherein each transparent switch member comprises a pliable silicon membrane.

20. A gaming apparatus as defined in claim 15, wherein the display unit comprises a liquid crystal display.

21. A gaming apparatus as defined in claim 15, wherein the display unit comprises a cathode ray tube.

22. A gaming apparatus as defined in claim 15, wherein each transparent switch member comprises a plastic switch.

23. The gaming apparatus of claim 15, wherein each transparent switch member comprises a molded hinge portion adjacent the tactile feedback portion.

24. A gaming apparatus comprising:

a value input device;

a first display unit that is capable of generating video images for displaying an outcome to a wager-based game;

a control panel disposed below said first display unit designed or configured to receive inputs for making wagers and for making game decisions associated with a play of the wager-based game displayed on said first display unit, said control panel comprising;

a second display unit that is capable of generating video images, the second display unit being separate from the first display unit;

a transparent touch screen surface covering at least a portion of the second display unit;

a plurality of transparent switch members for receiving the inputs associated with the play of at least a first wager-based game or the play of a second wager-based game wherein the plurality of transparent switch members are used to provide one or more different functions depending on whether the casino gaming unit is configured for the play of the first wager-based game or the play of the second wager-based game, each transparent switch member covering at least a portion of the touch screen surface, each transparent switch member structured to avoid contact with the transparent touch screen surface when each transparent switch member is in a first position, each transparent switch member structured to contact the transparent touch screen surface when each transparent switch member is in a second position, each transparent switch member having a tactile feedback portion structured to provide tactile feedback when each transparent switch member is depressed by a human operator, each transparent switch member having a touch screen contact member extending from the tactile feedback portion for electrically engaging the transparent touch screen surface, wherein the touch screen contact member is located between the tactile feedback portion and the transparent touch screen surface; and a controller operatively coupled to the value input device, the first display unit, the control panel, and the transparent touch screen surface, the controller comprising a processor and a memory operatively coupled to the processor, the controller being programmed to receive from the control panel an input signal indicating a selection of the first wager-based game;

in response to receiving the selection of the first wager-based game, the controller being programmed to cause the first display unit to display the video images associated with the first wager-based game;

in response to receiving the selection of the first wager-based game, the controller being programmed to cause the second display unit to display first video images for a first plurality of input indicators, each of the first plurality of input indicators associated with one of the plurality of transparent switch members such that each of the first plurality of input indicators is visible through the one of the plurality of transparent switch members, said first plurality of input indicators for making the wagers and the game decisions associated with the first wager-based game, the controller being programmed to receive from the control panel an input signal indicating a selection of the second wager-based game;

in response to receiving the selection of the second wager-based game, the controller being programmed to cause the first display unit to display the video images associated with the second wager-based game;

in response to receiving the selection of the second wager-based game, the controller being programmed to cause second video images for a second plurality of input indicators to be generated on the display unit, said second plurality of input indicators different from said first plurality of input indicators, each of the said second plurality of input indicators associated with one of the plurality of transparent switch members such that each of the second plurality of input indicators is visible through the one of the plurality of transparent switch members, said second plurality of input indicators for making the wagers and the game decisions associated with the second wager-based game the controller being programmed to receive an input signal from the transparent touch screen surface in response to a depression of each transparent switch member;

the controller being programmed to determine a value payout associated with an outcome of the wager-based game.

25. A gaming apparatus as defined in claim 24, wherein the transparent switch member comprises a lens structured to magnify the second image.

26. A gaming apparatus as defined in claim 25, wherein the lens comprises a glass lens.

27. A gaming apparatus as defined in claim 25, wherein the lens comprises a polyurethane lens.

28. A gaming apparatus as defined in claim 24, wherein the controller is further programmed to select the first video images from a plurality of images based on a setup input indicative of the first wager-based game.

29. A gaming apparatus as defined in claim 24, wherein the controller is further programmed to periodically change the first video images.

30. A gaming apparatus as defined in claim 24, wherein each transparent switch member comprises a pliable silicon membrane.

31. A gaming apparatus as defined in claim 24, wherein each transparent switch member comprises a plastic switch.

32. The gaming apparatus of claim 24, wherein each transparent switch member comprises a molded hinge portion adjacent the tactile feedback portion.

* * * * *

UNITED STATES PATENT AND TRADEMARK OFFICE
CERTIFICATE OF CORRECTION

PATENT NO. : 7,628,701 B2
APPLICATION NO. : 10/178283
DATED : December 8, 2009
INVENTOR(S) : William Wells It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 351 days.

Signed and Sealed this

Second Day of November, 2010

David J. Kappos

David J. Kappos
*Director of the United States Patent and Trademark Office*

UNITED STATES PATENT AND TRADEMARK OFFICE

CERTIFICATE OF CORRECTION

PATENT NO. : 7,628,701 B2
APPLICATION NO. : 10/178283
DATED : December 8, 2009
INVENTOR(S) : William R. Wells It is certified that error appears in the above-identified patent and that said Letters Patent is hereby corrected as shown below:

CLAIMS:

Column 17, line 49 change “of a the” to --of the--.

Signed and Sealed this
Eighteenth Day of January, 2011

David J. Kappos
*Director of the United States Patent and Trademark Office*